(12) United States Patent
Ikarashi et al.

(10) Patent No.: US 12,053,806 B2
(45) Date of Patent: Aug. 6, 2024

(54) DIE BONDING APPARATUS, CLEANING HEAD AND MANUFACTURING METHOD FOR SEMICONDUCTOR DEVICE

(71) Applicant: Fasford Technology Co., Ltd., Minami-Alps (JP)

(72) Inventors: Itsuki Ikarashi, Minami-Alps (JP); Akira Saito, Minami-Alps (JP)

(73) Assignee: Fasford Technology Co., Ltd., Minami-Alps (JP)

(*) Notice: Subject to any disclaimer, the term of this patent is extended or adjusted under 35 U.S.C. 154(b) by 202 days.

(21) Appl. No.: 17/380,652

(22) Filed: Jul. 20, 2021

(65) Prior Publication Data

US 2022/0055077 A1  Feb. 24, 2022

(30) Foreign Application Priority Data

Aug. 18, 2020  (JP) .................. 2020-137836

(51) Int. Cl.
*B08B 5/04*  (2006.01)
*B08B 5/02*  (2006.01)
(Continued)

(52) U.S. Cl.
CPC .................. *B08B 5/04* (2013.01); *B08B 5/02* (2013.01); *B08B 5/023* (2013.01); *B08B 5/043* (2013.01);
(Continued)

(58) Field of Classification Search
CPC ........ B08B 4/04–043; B08B 4/02–023; B08B 13/00; B08B 15/04; H01L 24/97;
(Continued)

(56) References Cited

U.S. PATENT DOCUMENTS

| 2007/0199580 A1* | 8/2007 | Hasebe | ................... B08B 15/04 15/310 |
| 2012/0079672 A1* | 4/2012 | Cho | ................... H01L 21/67028 15/345 |
| 2012/0241096 A1* | 9/2012 | Yamagami | ........ H01L 21/67144 134/115 R |

FOREIGN PATENT DOCUMENTS

CN  107871684 A  *  4/2018  ........... H01L 21/563
CN  107871684 A     4/2018
(Continued)

OTHER PUBLICATIONS

Chinese-language Office Action issued in Chinese Application No. 202110930645.5 dated Dec. 21, 2022 (11 pages).
(Continued)

*Primary Examiner* — Marcos D. Pizarro
(74) *Attorney, Agent, or Firm* — Crowell & Moring LLP

(57) ABSTRACT

A die bonding apparatus includes: a transfer section for transferring a substrate on which a die is to be mounted in a first direction; a cleaning head including a first nozzle, a second nozzle, and a suction aperture; and a drive section that moves the cleaning head in a second direction. The suction aperture first and second sides extend in the first direction in a planar view, and is disposed between blowout openings of the first nozzle and the second nozzle. The blowout opening of the first nozzle extends along the first side of the suction aperture in a planar view, and perpendicularly to a surface of the substrate. The blowout opening of the second nozzle extends along the second side of the suction aperture in a planar view, and aslant toward the suction aperture rather than perpendicularly to the surface of the substrate.

3 Claims, 16 Drawing Sheets

(51) Int. Cl.
*B08B 13/00* (2006.01)
*B08B 15/04* (2006.01)
*H01L 21/02* (2006.01)
*H01L 21/67* (2006.01)
*H01L 23/00* (2006.01)

(52) U.S. Cl.
CPC .............. *B08B 13/00* (2013.01); *B08B 15/04* (2013.01); *H01L 21/02076* (2013.01); *H01L 21/67028* (2013.01); *H01L 24/97* (2013.01)

(58) Field of Classification Search
CPC ....... H01L 21/02076; H01L 21/67–677; H01L 21/67028
USPC ......................................................... 438/160
See application file for complete search history.

(56) References Cited

FOREIGN PATENT DOCUMENTS

| | | | | |
|---|---|---|---|---|
| CN | 109478508 A | * | 3/2019 | ............... B08B 5/00 |
| CN | 109478508 A | | 3/2019 | |
| JP | 2012-199458 A | | 10/2012 | |
| JP | 2018-56169 A | | 4/2018 | |
| WO | WO 2017/204333 A1 | | 11/2017 | |

OTHER PUBLICATIONS

Japanese-language Office Action issued in Japanese Application No. 2020-137836 dated Feb. 6, 2024 with English translation (10 pages).

* cited by examiner

DIE BONDING APPARATUS, CLEANING HEAD AND MANUFACTURING METHOD FOR SEMICONDUCTOR DEVICE

CLAIM OF PRIORITY

The present application claims priority from Japanese patent application JP2020-137836 filed on Aug. 18, 2020, the content of which is hereby incorporated by reference into this application.

BACKGROUND

The present disclosure relates to a die bonding apparatus and, the present disclosure can be applied to a die bonding apparatus equipped with, for example, a device for cleaning substrates.

As one of semiconductor device manufacturing processes, there is a process in which a semiconductor chip (hereinafter, simply referred to as a die) is mounted on a wiring substrate, a lead frame, or the like (hereinafter, simply referred to as a substrate) to assemble a package. As a part of the process for assembling a package, there are the step of separating a die from a semiconductor wafer (hereinafter, simply referred to as a wafer) (dicing step) and the bonding step of mounting the separated die to the substrate. A semiconductor manufacturing apparatus used for the bonding step is a die bonding apparatus called a die bonder or the like.

An adhesive agent is used for bonding a die to a substrate, and when the die is bonded to the substrate, if pieces of dirt are adhering to the surface of the substrate, the adhesive strength of the adhesive agent decreases, so that it is very important to remove these pieces of dirt (hereinafter, referred to as foreign bodies) on the substrate when mounting the die on the substrate. For example, Japanese Unexamined Patent Application Publication No. 2012-199458 proposes a method in which a foreign body removal device, which is equipped with a cleaning nozzle having an integral combination of an air blowout hole and an air suction hole, is moved orthogonally to a direction in which a substrate moves to remove foreign bodies on the substrate.

SUMMARY

With the multilayering of laminate bonding and warps of a substrate associated with the multilayering of laminate bonding, it becomes necessary to widen a space between a nozzle, which is used for removing foreign bodies on the surface of the substrate and the surface of a die mounted on the substrate, and the substrate. In addition, it is necessary in this case that a foreign body removal device should increase its air blowout amount (air blowout strength) in order to increase its capacity for removing foreign bodies. Therefore, foreign bodies on a substrate diffuse to the outside of the cleaning nozzle of the foreign body removal device, so that it is possible that foreign bodies diffuse to areas which have already been cleaned up.

An object of the present disclosure is to provide a die bonding apparatus that can clean the surface of a substrate while preventing foreign bodies from diffusing.

The outline of a typical die bonding apparatus included in the present disclosure is described as follows. To put it concretely, the die bonding apparatus includes: a transfer section for transferring a substrate on which a die is to be mounted in a first direction; a cleaning head including a first nozzle, a second nozzle, and a suction aperture; and a drive section that moves the cleaning head in a second direction. The suction aperture has a first side and a second side extend in the first direction in a planar view, and the suction aperture is disposed between a blowout opening of the first nozzle and a blowout opening of the second nozzle while being located near to the both blowout openings. The blowout opening of the first nozzle is configured to extend along the first side of the suction aperture in a planar view, and is also configured to extend perpendicularly to a surface of the substrate. The blowout opening of the second nozzle is configured to extend along the second side of the suction aperture in a planar view, and is also configured to extend aslant toward the suction aperture rather than perpendicularly to the surface of the substrate.

According to the above die bonding apparatus, the surface of a substrate can be cleaned while foreign bodies are prevented from diffusing.

DESCRIPTION OF THE PREFERRED EMBODIMENTS

Figure 1:
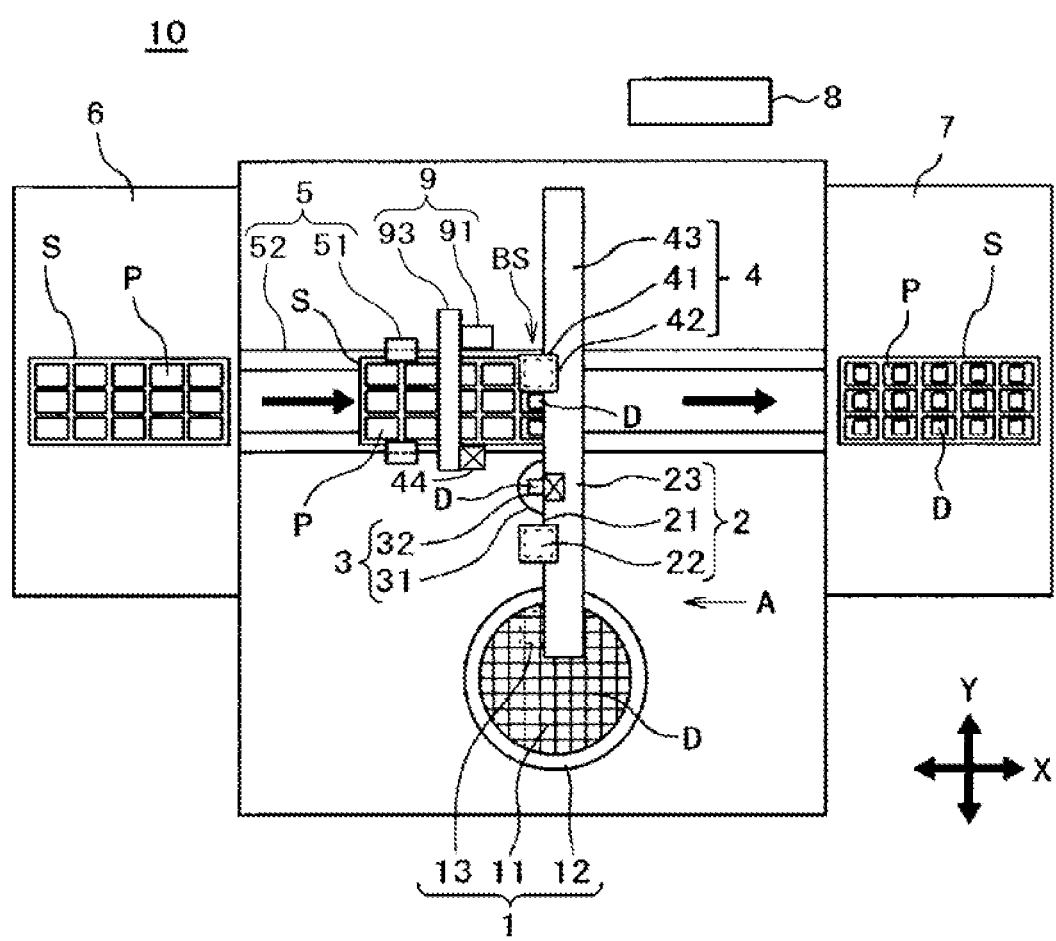
FIG. 1 is a schematic top view showing a die bonder of an example.

A foreign body removal apparatus according to an embodiment of the present disclosure removes foreign bodies on works such as wafers, substrates on which dice are to be mounted, substrates on which dice were mounted, dice mounted on substrates, and the like. The foreign body removal device includes, for example, a cleaning nozzle or a cleaning head. The cleaning nozzle or the cleaning head includes a suction opening at the center thereof, and blowout openings in such a way that the suction opening is sandwiched between the blowout openings or is surrounded by the blowout openings.

According to this embodiment, regardless of the size of a space between the foreign body removal device and a substrate, the diffusion of foreign bodies is suppressed, and foreign bodies are prevented from diffusing to areas which have already been cleaned, and contaminations inside the die bonding apparatus owing to the diffusion of foreign bodies from the foreign body removal device to the outside thereof can be prevented. Furthermore, since it is unnecessary to deal with the diffusion of foreign bodies by increasing air blowout amount, utilities for blowing out a large amount of air becomes unnecessary, which leads to the small footprint and the suppression of the increase of the associated cost.

Hereinafter, an example and modification examples will be explained with reference to the accompanying drawings. Here, in the following descriptions, the same components are given the same reference signs, and redundant explanations about the same components will be omitted in some cases. Furthermore, there are some cases where, in order to make the descriptions clearer, the widths, thicknesses, shapes, and the like of respective portions of the example and the modification examples are schematically depicted differently from what those really are in the drawings, but these descriptions show only schematic examples, so that the interpretation of the present disclosure is not limited to these descriptions.

EXAMPLE

Figure 2:
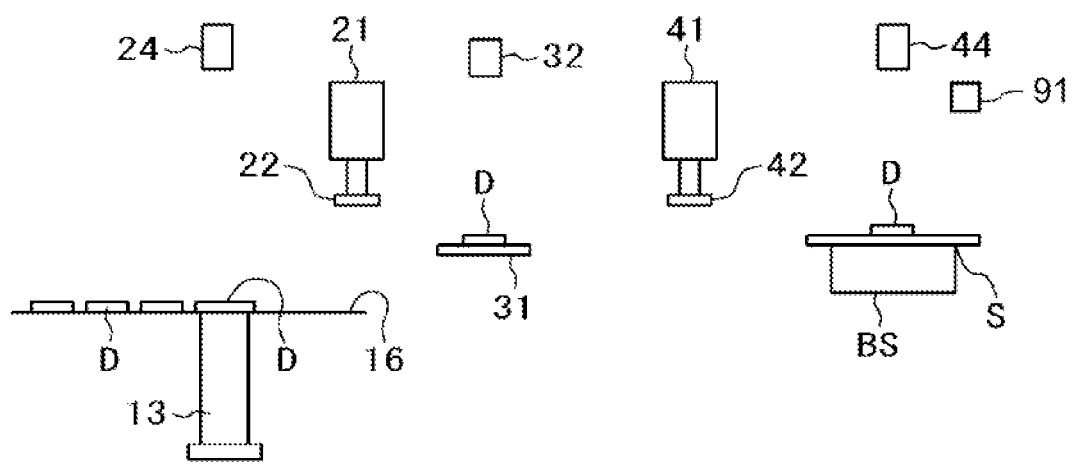
FIG. 2 is a schematic side view as viewed from an arrow A shown in FIG. 1.

FIG. 1 is a schematic top view showing a die bonder of an example. FIG. 2 shows a schematic configuration of a pickup head, a bonding head, and the peripheral portions of the above components and a schematic side view used for explaining the behaviors of the above components and peripheral portions as viewed from an arrow A shown in FIG. 1.

Schematically describing, the die bonder 10 includes: a die feed section 1 that feeds dice D to be mounted on a substrate S; a pickup section 2; an intermediate stage section 3; a bonding section 4; a transfer section 5; a substrate feed section 6; a substrate carrying-out section 7; a preform section 9, and a control section 8 that monitors and controls the behaviors of the respective sections. Here, the substrate S is a planar member, and one or plural product areas (hereinafter, referred to as packages P) each of which finally becomes one package are printed on the substrate S.

Assuming that, in FIG. 1, a direction in which the substrate S is guided and transferred horizontally by a transfer lane 52 is the X axis direction as a first direction, a direction that is in the same plane as the X axis direction and orthogonal to the X axis direction is the Y axis direction as a second direction, and a direction vertical to the horizontal plane is the Z axis direction, the following descriptions will be made. The Y axis direction is a direction along which the die bonder 10 moves back and forth, and the X axis direction is a direction along which the die bonder 10 moves left and right. The die feed section 1 is disposed on the front portion of the die bonder 10 and the bonding section 4 is disposed on the rear portion.

First, the die feed section 1 feeds a die D to be mounted on a package area P of the substrate S. The die feed section 1 includes: a wafer hold stage 12 for holding a wafer 11; a push-up unit 13 that pushes up a die D from the wafer 11 and is shown in dashed lines. The die feed section 1 is moved in the X axis direction or Y axis direction by unshown drive means, and moves a die D to be picked up to the position of the push-up unit 13.

The pickup section 2 includes: a pickup head 21 for picking up a die D; a Y drive section 23 for moving the pickup head 21 in the Y axis direction; unshown drive sections for moving a collet 22 up and down, rotating the collet 22, and moving the collet 22 in the X axis direction respectively. The pickup head 21 includes the collet 22 (also see FIG. 2) for sucking and holding the pushed-up die D at its tip, and picks up the die D from the die feed section 1 to mount the die D on an intermediate stage 31. The pickup head 21 includes unshown drive sections for moving the collet 22 up and down, rotating the collet 22, and moving the collet 22 in the X axis direction respectively.

The intermediate stage section 3 includes: the intermediate stage 31 on which a die D is temporally mounted; and a stage recognition camera 32 for recognizing a die D on the intermediate stage 31.

The bonding section 4 picks up a die D from the intermediate stage 31, and bonds the die D to a package area P of a substrate S that is transferred to a bonding stage BS or bonds the die D to a die already-bonded on the package area P of the substrate S in such a manner that these dice are laminated. The bonding section 4 includes: a bonding head 41 having a collet 42 (also see FIG. 2) for sucking and holding a die D at its tip as is the case with the pickup head 21; a Y drive section 43 for moving the bonding head 41 in the Y axis direction; a substrate recognition camera 44 for photographing the position recognition mark (not shown) of a package area P of a substrate S to recognize a bonding position in the package area P. With such a configuration, the bonding head 41 corrects the pickup position/posture of a die D on the basis of the photographed data of the stage recognition camera 32, picks up the die D from the intermediate stage 31, and bonds the die D to a substrate S on the basis of the photographed data of the substrate recognition camera 44.

The transfer section 5 includes: a substrate transfer claw 51 used for clawing and transferring a substrate S; and a transfer lane 52 along which the substrate S is moved. The substrate S is moved by driving the unshown nuts of the substrate transfer claw 51 fixed to the transfer lane 52 by unshown ball screws fixed along the transfer lane 52. With the use of such a configuration, the substrate S is moved from the substrate feed section 6 to the bonding position along the transfer lane 52, and after the die D is bonded, the substrate S is moved to the substrate carrying-out section 7, and is passed to the substrate carrying-out section 7.

The control section 8 includes: memories for storing programs (software) for monitoring and controlling the behaviors of the respective sections of the die bonder 10; and a central processor unit (CPU) for executing the programs stored in the memories. For example, the control section 8 brings in various kinds of information such as image information, the position of the bonding head 41, and the like from the substrate recognition camera 44, and controls various behaviors of the respective components such as the bonding operation of the bonding head 41.

The preform section 9 includes a cleaning head 91 as a foreign body removal device and a drive section 93 that drives the cleaning head 91 in the X axis direction, the Y axis direction, or the Z axis direction.

Figure 3:
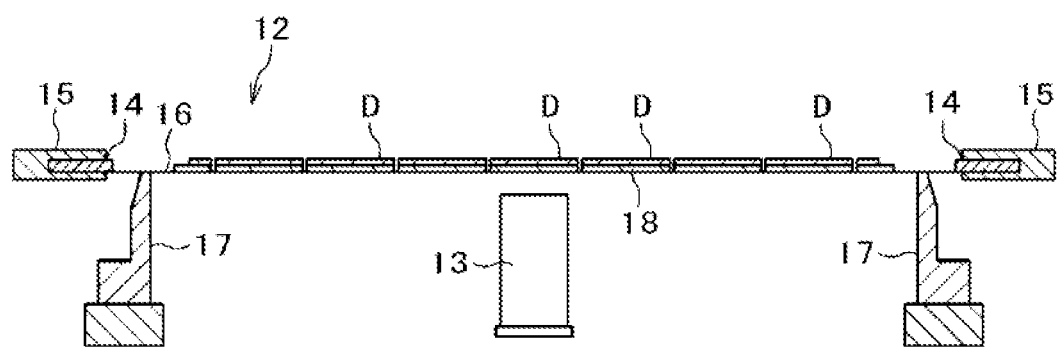
FIG. 3 is a schematic cross-sectional view showing the main portion of a die feed section shown in FIG. 1.

Next, the configuration of the die feed section 1 will be explained with reference to FIG. 3. FIG. 3 is a schematic cross-sectional view showing the main portion of the die feed section.

The die feed section 1 includes: the wafer hold stage 12 that moves in the horizontal directions (the X axis direction and the Y axis direction); and the push-up unit 13 that moves up and down. The wafer hold stage 12 includes: an expand ring 15 that holds a wafer ring 14; and a support ring 17 that horizontally positions a dicing tape 16 that is held by the wafer ring 14 and to which plural dice D are bonded. The push-up unit 13 is disposed inside of the support ring 17.

When a die D is pushed up, the die feed section 1 brings down the expand ring 15 that supports the wafer ring 14. As a result, the dicing tape 16 supported by the wafer ring 14 is stretched, spaces among dice D are expanded, and the die D is pushed up from under the die D itself by the push-up unit 13, which improves die D picked-up performance. Now, along with the thinning of components, a bonding agent for bonding a die to a substrate has changed from a liquid agent to a film agent, and a film-shaped bonding material called a die attach film (DAF) 18 is attached to the wafer 11 and the dicing tape 16 in such a way that the film-shaped bonding material is sandwiched in between the wafer 11 and the dicing tape 16. If a wafer 11 includes the die attach film 18, dicing is executed on both wafer 11 and die attach films 18. Therefore, in the step of peeling, the wafer 11 and the die attach film 18 are peeled off from the dicing tape 16. The die attach film 18 is hardened by heat.

Figure 4:
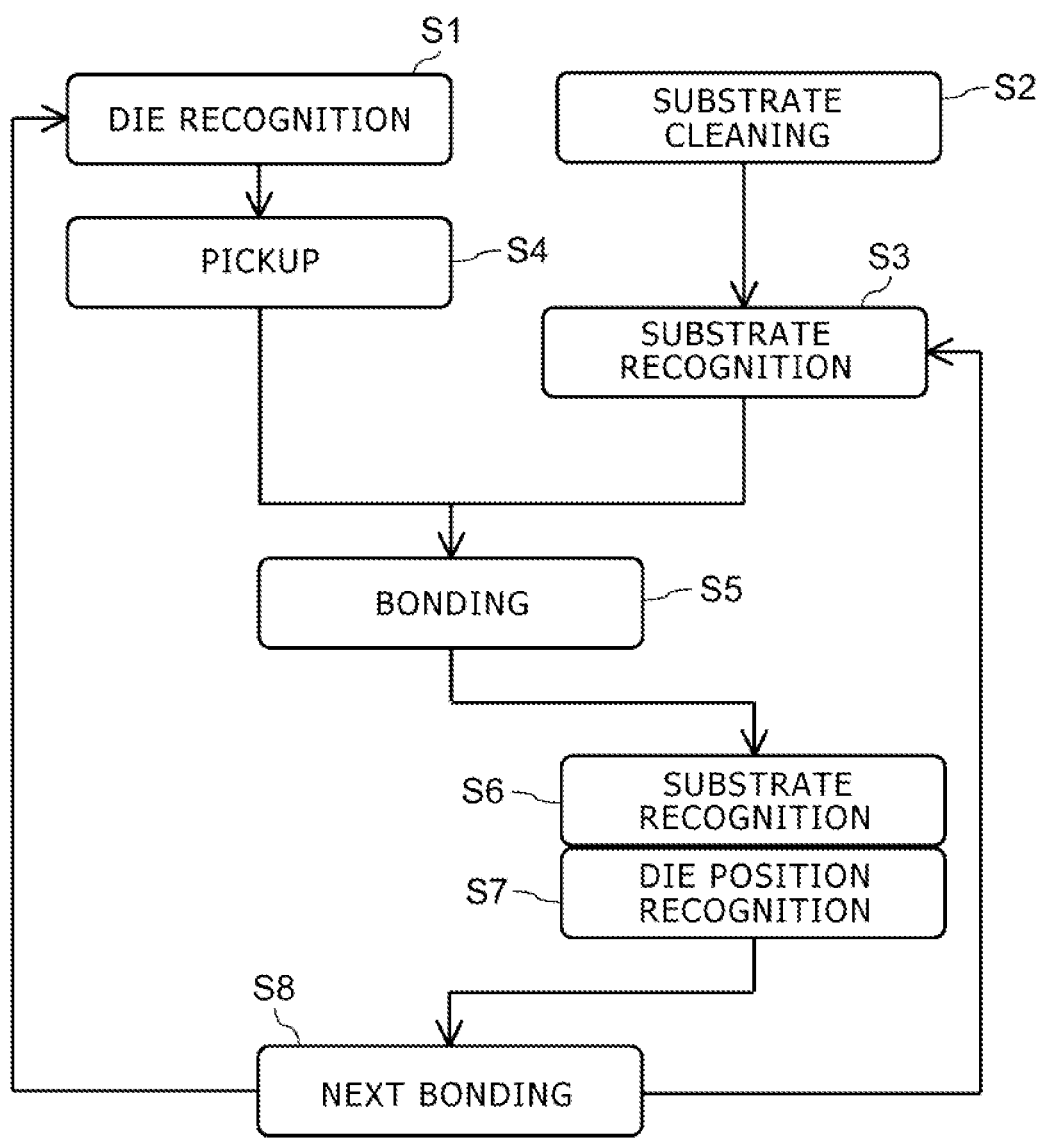
FIG. 4 is a flowchart used for explaining the step of die bonding in the die bonder shown in FIG. 1.

FIG. 4 is a flowchart used for explaining the steps of die bonding in the die bonder shown in FIG. 1.

In the steps of die bonding in this example, first the wafer ring 14 that holds the dicing tape 16, to which a die D separated from the wafer 11 is attached, is stored in a wafer cassette (not shown), and the wafer cassette is carried in the die bonder 10. In addition, a substrate S is prepared and carried in the die bonder 10.

(Die Recognition: Step S1)

The control section 8 brings out the wafer ring 14 holding the wafer 11 from the wafer cassette, and mounts the wafer ring 14 on the wafer hold stage 12, and transfers the wafer hold stage 12 to a reference position where a die D is picked up (wafer loading). Next, the control section 8 executes fine adjustment (alignment) so that the disposed position of the wafer 11 accurately coincides with the reference position with reference to an image obtained by the wafer recognition camera 24.

Next, the control section 8 moves the wafer hold stage 12 on which the wafer 11 is mounted at predefined pitches and keeps the wafer hold stage 12 horizontal, so that a die D to be picked up first is disposed in the relevant pickup position (die transfer). As for the inspection of the wafer 11, every die on the wafer is inspected in advance by an inspection device such as a prover, and map data that shows the good or bad for every die is created, and the map data is stored in the storage device of the control section 8. Judgment whether the pickup target die D is good or bad is performed on the basis of the map data. If the die D is bad, the control section 8 moves the wafer hold stage 12 on which the wafer 11 is mounted at the predefined pitches, and disposes a die D to be picked up next in the relevant pickup position, and skips the bad die D.

The control section 8 photographs the main surface (top surface) of the pickup target die D using the wafer recognition camera 24, and with reference to the obtained image, the control section 8 calculates the displacement amount of the pickup target die D from the pickup position. The control section 8 moves the wafer hold stage 12 on which the wafer 11 is mounted on the basis of this displacement amount, and accurately disposes the pickup target die D in the pickup position. The control section 8 executes the surface inspection of the pickup target die D on the basis of the image obtained by the wafer recognition camera 24.

(Substrate Cleaning: Step S2)

The control section 8 loads the substrate S on the transfer lane 52 in the substrate feed section 6 (substrate loading). The control section 8 moves the substrate S to a cleaning position in front of the bonding position (substrate transfer). The control section 8 removes foreign bodies on the surface of the substrate S. The control section 8 executes the cleaning of the substrate S by making the cleaning head 91 perform back-and-forth movements in the range of the width of the substrate S along the Y axis direction using the drive section 93. After a first row in the substrate S along the Y axis direction is cleaned, the control section 8 moves the substrate S in the X axis direction in order to sequentially clean a second row and subsequent rows in the substrate S. It is also conceivable that the control section 8 makes the cleaning head 91 perform one back-and-forth movement for cleaning two rows (one row is cleaned in a forth movement and the other is cleaned in a back movement). The details of the cleaning work will be explained later.

(Substrate Recognition: Step S3)

The control section 8 photographs the substrate using the substrate recognition camera 44 in order to recognize the position of a package area P of the substrate S and execute positioning before executing bonding. The control section 8 executes the surface inspection of the package area P of the substrate S on the basis of an image obtained using the substrate recognition camera 44.

(Pickup: Step S4)

After accurately disposing the pickup target die D in the pickup position, the control section 8 picks up the die D from the dicing tape 16 using the pickup head 21 having the collet 22 and mounts the die D on the intermediate stage 31. The control section 8 executes the detection of the postural misalignment (rotational misalignment) of the die mounted on the intermediate stage 31 by photographing the die using the stage recognition camera 32. If there is postural misalignment, the control section 8 turns the intermediate stage 31 in a plane parallel with a mounting plane including a mounting position using a turning drive device (not shown) fixed to the intermediate stage 31 in order to correct the postural misalignment. The control section 8 executes the surface inspection of the die D on the basis of an image obtained by the stage recognition camera 32.

(Bonding: Step S5)

The control section 8 picks up the die D from the intermediate stage 31 using the bonding head 41 including the collet 42, and bonds the picked-up die D to the package area P of the substrate S or to a die that has already been bonded to the package area P of the substrate S on the basis of the substrate recognition result obtained at step S3.

(Substrate Recognition: Step S6)

After bonding the die D, the control section 8 checks whether the position to which the die D is bonded is accurate or not. In order to inspect the bonding implementation result, the control section 8 photographs the package area P of the substrate S again using the substrate recognition camera 44 and executes the position recognition of the package P of the substrate S.

(Die Position Recognition: Step S7)

The control section 8 photographs the die D using the substrate recognition camera 44, executes the position recognition of the die D (step S7), and inspects the position of the bonded die D on the basis of the results of the substrate recognition and the die recognition. After comparing the position of the bonded die D with a pre-registered bonding position, the control section 8 outputs numerical values and executes inspection/judgment. The control section 8 inspects the surface of the die D using an image obtained using the substrate recognition camera 44.

(Next Bonding: Step S8)

The control section 8 makes the flow get back to step S1 or step S3. Subsequently, according to the same procedure as described above, dice D are peeled off from the dicing tape 16 one by one, and the dice D are bonded to the relevant package areas of the substrate S one by one.

After the bonding for one substrate S is finished, the substrate S is moved to the substrate carrying-out section 7 (substrate transfer), and the substrate is passed to the substrate carrying-out section 7 (substrate unloading). In addition, after the pickup of all the dice D except for defective dice D is finished, the dicing tape 16 and the wafer ring 14 that hold those dice D on the outer rim of the wafer 11 and the like are unloaded into the wafer cassette.

The dice D are mounted on the substrate S via die attach films 18 respectively, and are carried out from the die bonder. And then, the dice D are electrically connected to the electrodes of the substrate S via Au wires respectively in the step of wire bonding. In the case of laminated components being produced, the substrate S on which dice D are mounted is carried in the die bonder again, and second dice D are respectively laminated on the dice D mounted on the substrate S via die attach films 18. After the substrate S on which the dice D and the second dice D are laminated is carried out from the die bonder, the dice D and the second dice D are electrically connected to the electrodes of the substrate S via Au wires respectively in the step of wire bonding. After being peeled off from the dicing tape 16 in the abovementioned way, the second dice D are transferred to the step of pellet bonding, and are laminated on the already-bonded dice D respectively. After the above steps are repeated predefined times, the substrate S is transferred to a mold process, and plural dice D and Au wires are sealed by mold resin (not shown), so that laminated packages are completed.

Figure 5:
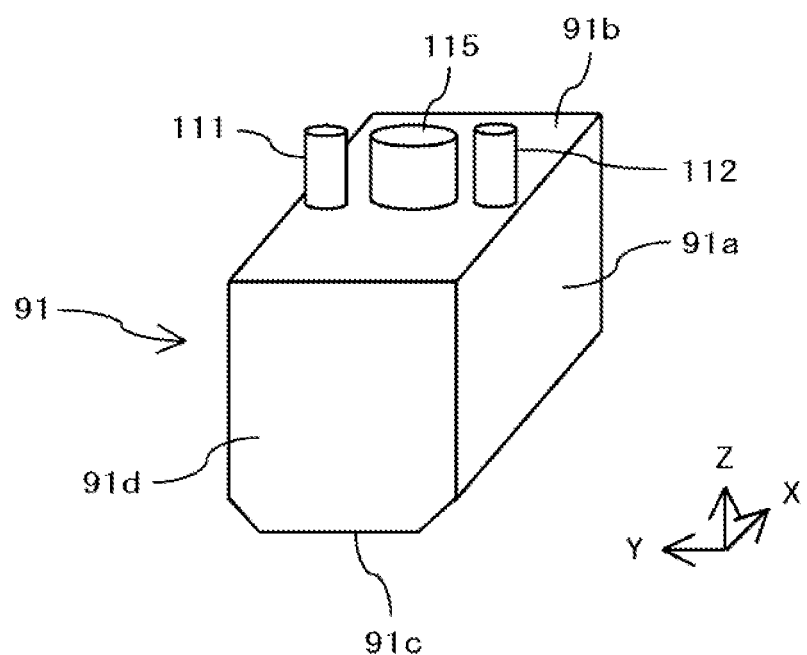
FIG. 5 is a schematic configuration diagram of a cleaning head shown in FIG. 1.
Figure 6:
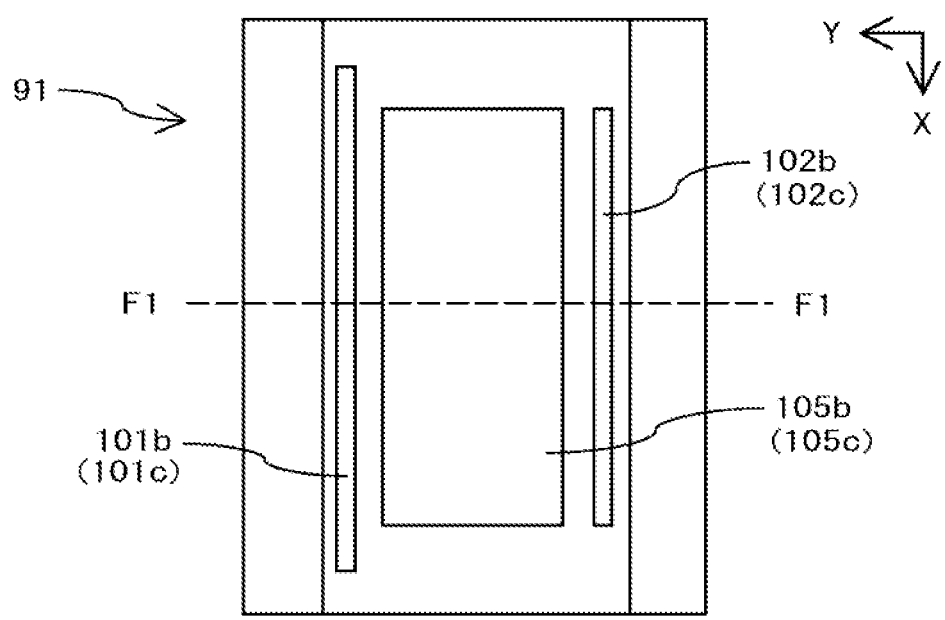
FIG. 6 is a bottom surface view of the cleaning head shown in FIG. 5.
Figure 7:
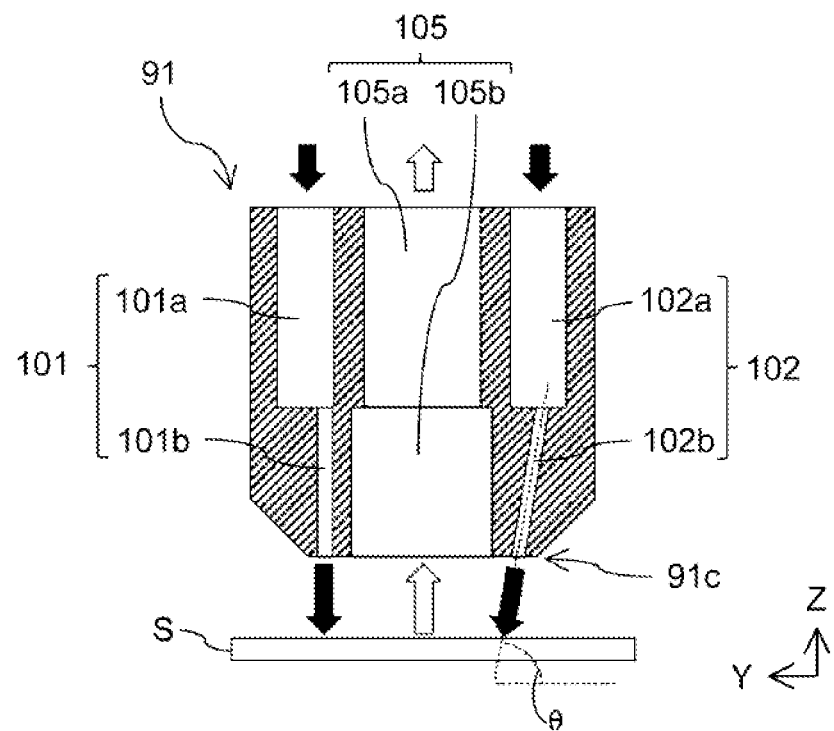
FIG. 7 is a cross-sectional view taken along a line F1-F1 shown in FIG. 6.
Figure 8:
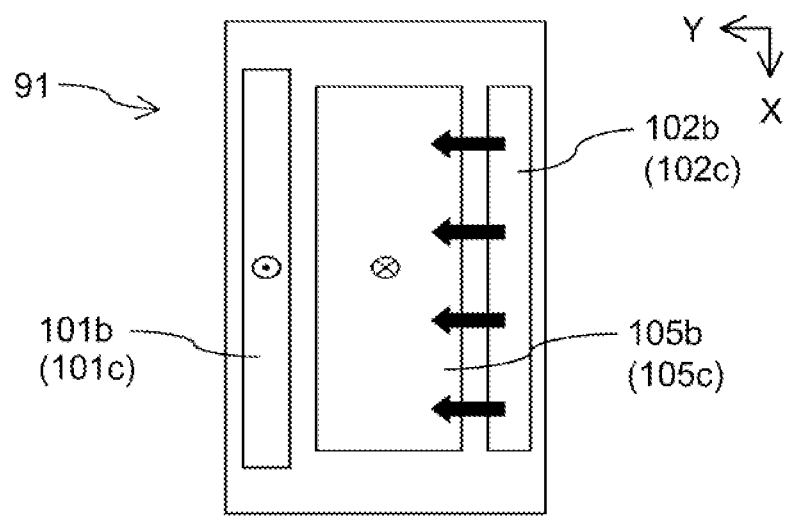
FIG. 8 is a bottom surface view used for explaining the behavior of the cleaning head shown in FIG. 7.

Next, the structure of the cleaning head 91 will be explained with reference to FIG. 5 to FIG. 8. FIG. 5 is a schematic configuration diagram of the cleaning head shown in FIG. 1. FIG. 6 is a bottom surface view of the cleaning head shown in FIG. 5. FIG. 7 is a cross-sectional view taken along the line F1-F1 shown in FIG. 6. FIG. 8 is a bottom surface view used for explaining the behavior of the cleaning head shown in FIG. 7.

As shown in FIG. 5, the body section of the cleaning head 91 is, for example, octahedral-shaped, and includes: a rectangular front surface 91a; a rectangular rear surface (not shown) that is a surface facing the front surface; a rectangular top surface 91b; a rectangular bottom surface 91c; a hexagonal side surface 91d; a hexagonal side surface (not shown) that is a surface facing the side surface 91d; and the like. The lengths of the top surface 91b and the bottom surface 91c in the X axis direction are configured to be longer than the lengths of the top surface 91b and the bottom surface 91c in the Y axis direction respectively, and the size of the bottom surface 91c is configured to be smaller than that of the top surface 91b. The side surface 91d is connected to the drive section 93, so that the cleaning head 91 is set movable in the Y axis direction, the Z axis direction, and the like.

A first supply pipe 111, a second supply pipe 112, and an exhaust pipe 115 are fixed to the upper portion of the body section of the cleaning head 91. The first supply pipe 111 and the second supply pipe 112 are respectively connected to devices (not shown) that supply compressed air and the like via flow rate control devices (not shown), the exhaust pipe 115 is connected to a suction device (not shown) such as a vacuum device or the like via a flow control device (not shown), and the flow rates of the respective supply pipes 111, 112 and exhaust pipe 115 are controlled by the control section 8. The pipe diameter of the exhaust pipe 115 is set larger than the pipe diameters of the first supply pipe 111 and the second supply pipe 112. This is because the exhaust pipe 115 is used for transferring foreign bodies.

As shown in FIG. 7, the cleaning head 91 includes: a first nozzle 101 connected to the first supply pipe 111; a second nozzle 102 connected to the second supply pipe 112; and a suction aperture 105 connected to the exhaust pipe 115 in the body section of its own.

The first nozzle 101 includes a through hole that is formed through the top surface to the bottom surface of the body section of the cleaning head 91 and the cross-section of which shows one large rectangle and one small rectangle, and a supply section 101a that is connected to the first supply pipe 111 is formed in the upper portion of the body section and a blowout opening 101b is formed in the lower portion. The first nozzle 101 includes an open end 101c on a nozzle surface that is the bottom end of the blowout opening 101b. The second nozzle 102 includes a through hole that is formed through the top surface to the bottom surface of the body section of the cleaning head 91 and the cross-section of which shows one large rectangle and one small rectangle, and a supply section 102a that is connected to the second supply pipe 112 is formed in the upper portion of the body section and a blowout opening 102b is formed in the lower portion. The second nozzle 102 includes an open end 102c on a nozzle surface that is the bottom end of the blowout opening 102b. The suction aperture 105 includes a through hole that is formed through the top surface to the bottom surface of the body section of the cleaning head 91 and the cross-section of which shows two rectangles, and an exhaust section 105*a* that is connected to the exhaust pipe 115 is formed in the upper portion of the body section and a suction opening 105*b* is formed in the lower portion. The suction aperture 105 includes an open end 105*c* on the bottom end of the suction opening 105*b*.

The cross-sectional areas of the blowout opening 101*b* of the first nozzle 101 and the blowout opening 102*b* of the second nozzle 102 are respectively set smaller than the cross-sectional areas of the supply section 101*a* and the supply section 102*a*. This is because the blowout opening 101*b* and the blowout opening 102*b* need to blow out air at high speeds to predefined places respectively. The cross-sectional area of the suction opening 105*b* is set larger than the cross-sectional area of the exhaust section 105*a*.

As shown in FIG. 6, the suction opening 105*b* of the suction aperture 105 is formed in the center of the bottom surface 91*c* of the cleaning head 91, and the blowout opening 101*b* of the first nozzle 101 and the blowout opening 102*b* of the second nozzle 102 are formed near to this suction opening 105*b* in such a way that the blowout openings 101*b* and 102*b* surround this suction opening 105*b*. The blowout opening 101*b* of the first nozzle 101, the blowout opening 102*b* of the second nozzle 102, and the suction opening 105*b* are rectangular in a planar view, and the blowout opening 101*b*, and the blowout opening 102*b* extend in the X axis direction and have elongated slit-like shapes respectively. The suction opening 105*b* has a rectangular shape having sides in the X axis direction longer than sides in the Y axis direction in a planar view, and has a very large opening area compared with the blowout opening 101*b* of the first nozzle 101 and the blowout opening 102*b* of the second nozzle 102. The length of the blowout opening 101*b* of the first nozzle 101 in the X axis direction is configured to be longer than the length of the blowout opening 102*b* of the second nozzle 102 and the length of the suction opening 105*b* in the X axis direction. The length of the blowout opening 102*b* of the second nozzle 102 in the X axis direction is almost equal to the length of the suction opening 105*b* in the X axis direction.

As shown in FIG. 7, it is preferable that the bottom surface 91*c* including the nozzle surface of the blowout opening 101*b* of the first nozzle 101 and the nozzle surface of the blowout opening 102*b* of the second nozzle 102 should be configured to be disposed in parallel with the substrate S, and the blowout opening 101*b* of the first nozzle 101 should be configured to extend perpendicularly to the surface of the substrate S from the supply section 101*a*, and the blowout opening 102*b* of the second nozzle 102 should be configured to extend aslant toward the suction opening 105*b* rather than perpendicularly to the surface of the substrate S from the supply section 102*a*. The first nozzle 101 blows out a band of air perpendicularly to the surface of the substrate S from the blowout opening 101*b*, and the second nozzle 102 blows out a band of air aslant downward toward the suction opening 105*b* of the suction aperture from the blowout opening 102*b* to the surface of the substrate S.

As shown in FIG. 8, the air blown out aslant downward from the blowout opening 102*b* of the second nozzle of the second nozzle 102 to the surface of the substrate S collides with the surface of the substrate S. Then the air blows away foreign bodies adhering to the surface of the substrate S in directions shown by arrows. The blown-away foreign bodies are dammed up by the band of air blown out from the blowout opening 101*b* of the first nozzle 101, sucked by the rectangular suction opening 105*b* of the suction aperture 105 near to the side of the blowout opening 102*b* shown by the arrows, and finally discarded. In other words, an air curtain is formed by the blowout opening 101*b* of the first nozzle 101 disposed perpendicularly to the substrate S, which makes it possible to prevent foreign bodies removed by the blowout opening 102*b* of the second nozzle 102 disposed aslant toward the surface of the substrate S from flowing out to the outside. Therefore, foreign bodies can be prevented from diffusing into parts of the surface of the substrate S that are areas on which cleaning has already executed and that are located downstream of the transfer direction of the cleaning head 91.

Furthermore, the blowout opening 102*b* of the second nozzle 102 disposed aslant toward the surface of the substrate S not only removes foreign bodies in a place where air collides with the surface of the substrate S but also can pull in surrounding foreign bodies (foreign body guidance) owing to an ejector effect that pulls in ambient air in the outside and bring about a winding effect owing to an air collision in the inside. Herewith, it is possible to effectively guide foreign bodies to the suction opening 105*b*.

It is preferable that an angle ($\theta$) between the direction in which the blowout opening 102*b* of the second nozzle 102 extends and the surface of the substrate S should be 60 degrees or smaller. If the angle ($\theta$) becomes larger than 60 degrees, the amount of air blown out to the outside increases, which makes it difficult to cause the abovementioned air pull-in effect.

In addition, it is preferable that the flow rate of air of the first nozzle 101 should be equal to or larger than the flow rate of air of the second nozzle 102. This is because the ratio of the flow rate of air sucked into the suction opening 105*b* of air blown out from the second nozzle 102 is larger than the ratio of the flow rate of air sucked into the suction opening 105*b* of air blown out from the first nozzle 101.

Figure 9:
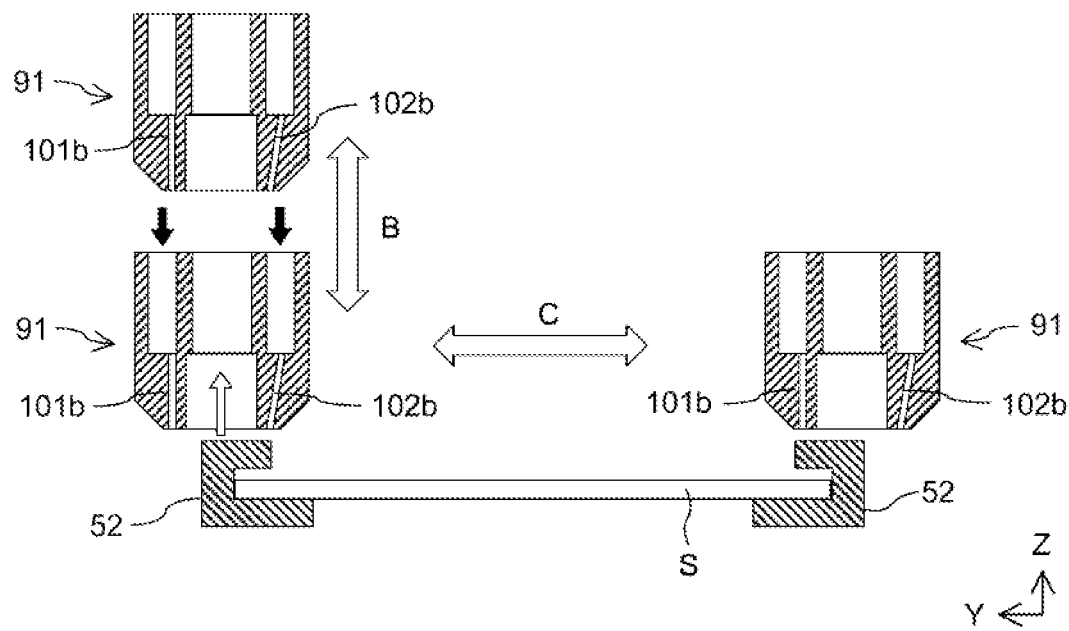
FIG. 9 is a cross-sectional view showing the movement of the cleaning head shown in FIG. 7.
Figure 10:
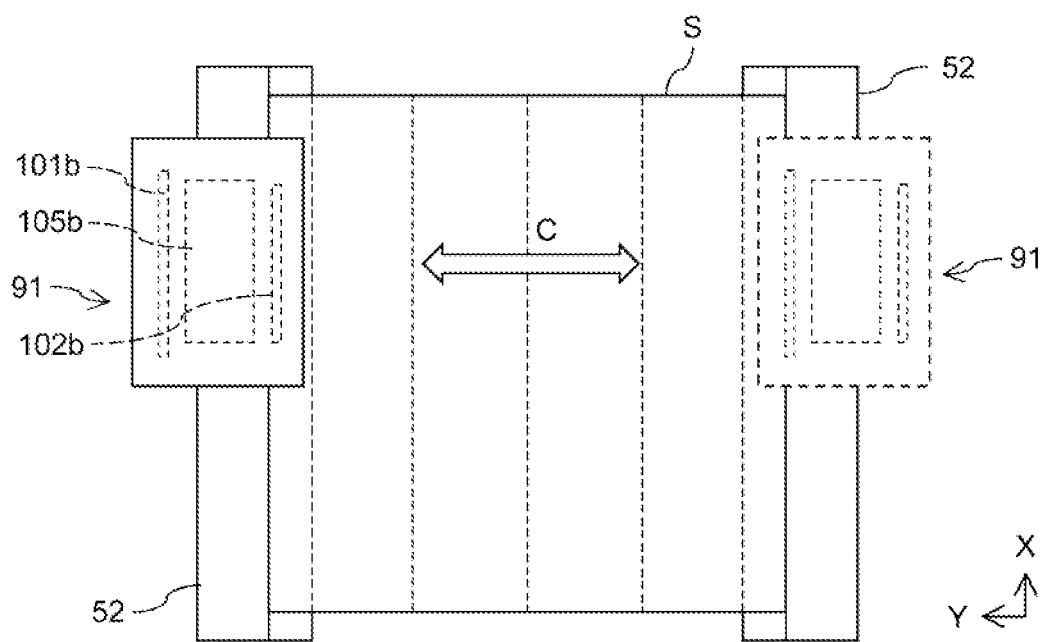
FIG. 10 is a top view of the cleaning head and a substrate shown in FIG. 9.

Next, the movement of the cleaning head 91 will be explained with reference to FIG. 9 and FIG. 10. FIG. 9 is a cross-sectional view showing the movement of the cleaning head shown in FIG. 7. FIG. 10 is a top view of the cleaning head and the substrate shown in FIG. 9.

The cleaning head 91 moves up and down along the Z axis direction as shown by an arrow B in FIG. 9, and usually the cleaning head 91 moves down to a proper position of the substrate S (where the bottom surface of the cleaning head 91 is 5 mm above the substrate S, for example) and then maintains that position. When the substrate S is moved or replaced with a new substrate S, the cleaning head 91 moves upwards. Furthermore, the cleaning head 91 moves in the width direction of the substrate S (the Y axis direction) as shown by an arrow C in FIG. 9 or FIG. 10 to remove foreign bodies. In other words, the rectangular cleaning head 91, which is rectangular in a planar view, moves in a direction (the Y axis direction) perpendicular to the direction (the X axis direction) in which the substrate S moves, while the directions of the long sides of the rectangular cleaning head 91 are parallel with a direction in which the substrate S moves. Here, it is preferable that a cleaning stage should be prepared under the substrate S in order to stabilize the substrate S while cleaning is being executed.

In this example, the width (the length in the Y axis direction) of the bottom surface 91*c*, which is the nozzle surface of the cleaning head 91, is set to a width with a necessary value in accordance with a cleaning processing time (a required through put). Herewith, the movement amount of the cleaning head 91 can be set arbitrary according to the width of the substrate S. Therefore, the cleaning processing according to this example can be applied to various kinds of the widths of the substrate S.

In addition, in this example, since the width of an area for foreign cleaning is widened by making the bottom surface 91c, which is the nozzle surface of the cleaning head 91, rectangular and the length of the bottom surface in the X axis direction longer, the cleaning efficiency can be improved owing to the shortening of the cleaning time.

Furthermore, in this example, since foreign bodies are prevented from scattering by air blown out perpendicularly to the surface of the substrate S from the first nozzle 101, a distance between the first nozzle 101 and the substrate S can be set larger than a distance between a cleaning nozzle and a substrate disclosed by Japanese Unexamined Patent Application Publication No. 2012-199458. Therefore, in this example, while the cleaning head 91 is prevented from getting contact with the substrate S or the like, the cleaning processing can be performed under an optimum cleaning condition such as an optimum distance between the substrate S and the cleaning head 91.

MODIFICATION EXAMPLES

Hereinafter, some typical modification examples will be illustrated. In the explanations about following modification examples, it will be assumed that components that have the same configurations and functions as described in the above example are given the same reference signs in the above examples. And it will also be assumed that the explanations made in the above-described example are appropriately incorporated for explanations about such components of the modification examples as far as there are no technological contradictions. In addition, a part of the above-described example, the entireties or parts of the plural modification examples can be applied appropriately and complexly as far as there are no technological contradictions.

First Modification Example

Figure 11:
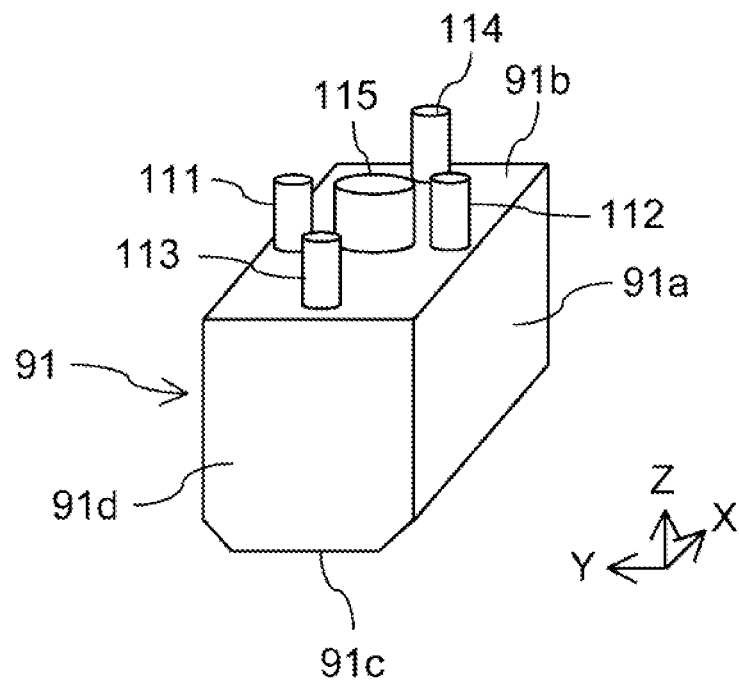
FIG. 11 is a schematic configuration diagram of a cleaning head according to a first modification example.
Figure 12:
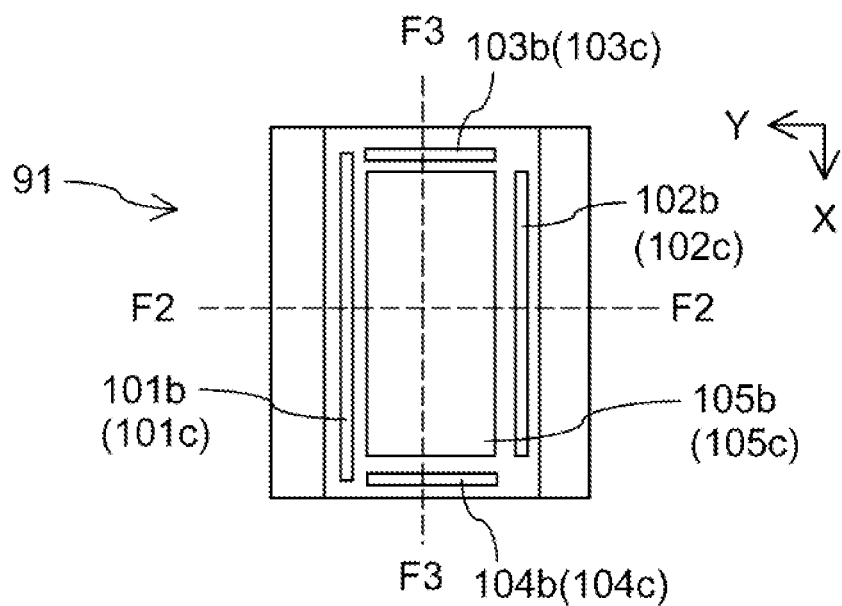
FIG. 12 is a bottom surface view of the cleaning head shown in FIG. 11.
Figures 13A, 13B:
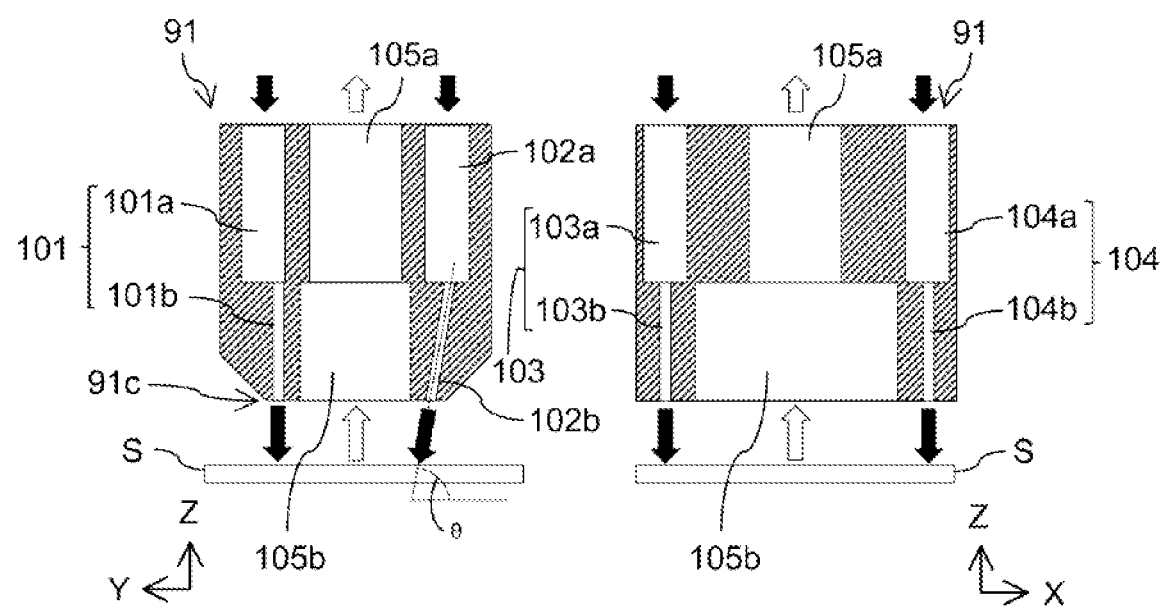
FIG. 13A is a cross-sectional view taken along a line F2-F2 shown in FIG. 12.
FIG. 13B is a cross-sectional view taken along a line F3-F3 shown in FIG. 12.

A cleaning head according to a first modification example will be explained with reference to FIG. 11, FIG. 12, FIG. 13A, and FIG. 13B. FIG. 11 is a schematic configuration diagram of the cleaning head according to the first modification example. FIG. 12 is a bottom surface view of the cleaning head shown in FIG. 11. FIG. 13A is a cross-sectional view taken along the line F2-F2 shown in FIG. 12, and FIG. 13B is a cross-sectional view taken along the line F3-F3 shown in FIG. 12.

As shown in FIG. 11, the cleaning head 91 according to the first modification example further includes: a third supply pipe 113 and a fourth supply pipe 114 on the upper portion of the body section of its own in comparison with the cleaning head according to the example. The third supply pipe 113 and the fourth supply pipe 114 are respectively connected to devices (not shown) that supply compressed air and the like via flow rate control devices (not shown), and the flow rates of the respective supply pipes are controlled by the control section 8.

Furthermore, as shown in FIG. 13A and FIG. 13B, the cleaning head 91 according to the first modification example further includes a third nozzle 103 connected to the third supply pipe 113 and a fourth nozzle 104 connected to the fourth supply pipe 114 in comparison with the cleaning head according to the example.

The third nozzle 103 includes a through hole that is formed through the top surface to the bottom surface of the body section of the cleaning head 91 and the cross-section of which shows one large rectangle and one small rectangle, and a supply section 103a that is connected to the third supply pipe 113 is formed in the upper portion of the body section and a blowout opening 103b is formed in the lower portion. The third nozzle 103 includes an open end 103c on a nozzle surface that is the bottom end of the blowout opening 103b of its own. The fourth nozzle 104 includes a through hole that is formed through the top surface to the bottom surface of the body section of the cleaning head 91 and the cross-section of which shows one large rectangle and one small rectangle, and a supply section 104a that is connected to the fourth supply pipe 114 is formed in the upper portion of the body section and a blowout opening 104b is formed in the lower portion. The fourth nozzle 104 includes an open end 104c on a nozzle surface that is the bottom end of the blowout opening 104b of its own. The cross-sectional areas of the blowout opening 103b of the third nozzle 103 and the blowout opening 104b of the fourth nozzle 104 are respectively set smaller than the cross-sectional areas of the supply section 103a and the supply section 104a.

As shown in FIG. 12, the suction opening 105b of a suction aperture 105 is formed in the center of the bottom surface 91c of the cleaning head 91, and the blowout opening 101b of a first nozzle 101, the blowout opening 102b of a second nozzle 102, the blowout opening 103b of the third nozzle 103, and the blowout opening 104b of the fourth nozzle 104 are formed in such a way that the blowout openings 101b, 102b, 103b, and 104b surround this suction opening 105b. The blowout opening 103b of the third nozzle 103 and the blowout opening 104b of the fourth nozzle 104 are rectangular in a planar view extend in the Y axis direction, and have elongated slit-like shapes respectively. The length of the blowout opening 103b of the third nozzle 103 and the length of the blowout opening 104b of the fourth nozzle 104 in the Y axis direction are almost equal to the length of the suction opening 105b in the Y axis direction. Herewith, foreign bodies can be prevented from scattering to the outside of the cleaning head 91. It is preferable that each of the flow rate of air blown out from the third nozzle 103 and that blown out from the fourth nozzle 104 should be equal to or smaller than the flow rate of air blown out from the first nozzle 101 lest the air blown out from the third nozzle 103 and that blown out from the fourth nozzle 104 should hinder foreign body removal processing performed by the other nozzles.

Second Modification Example

Figure 14:
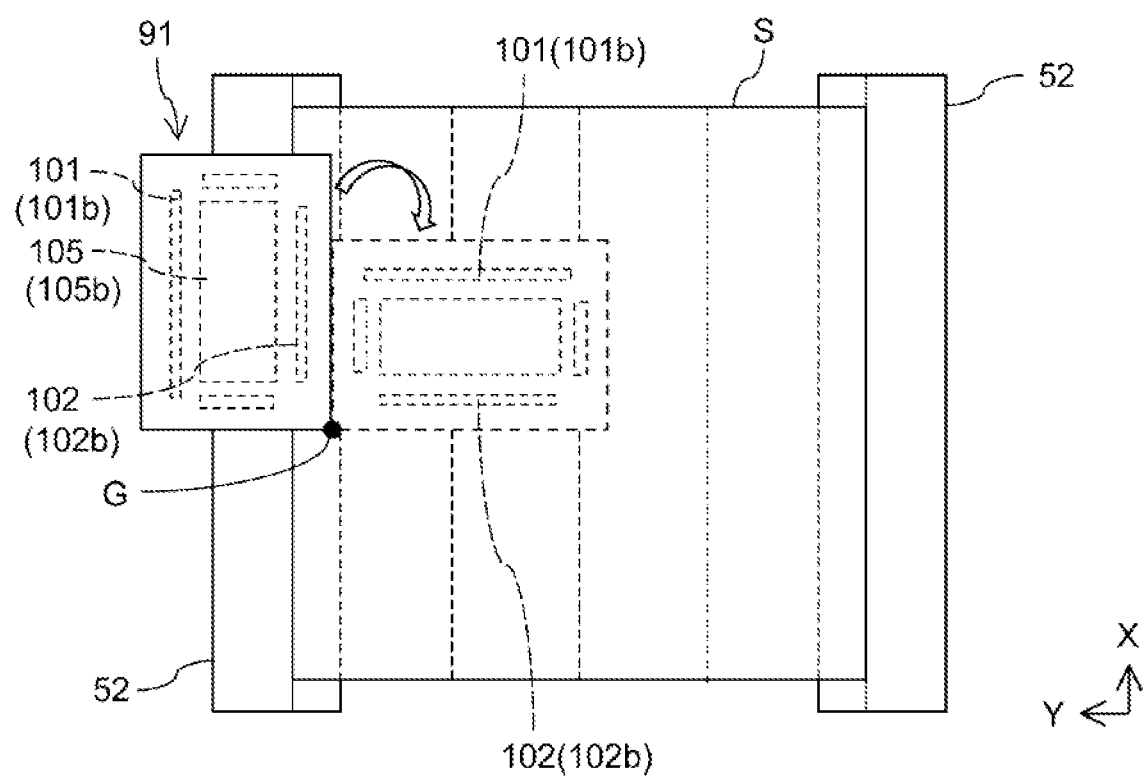
FIG. 14 is a top view showing a cleaning head and a substrate according to a second modification example.
Figure 15A:
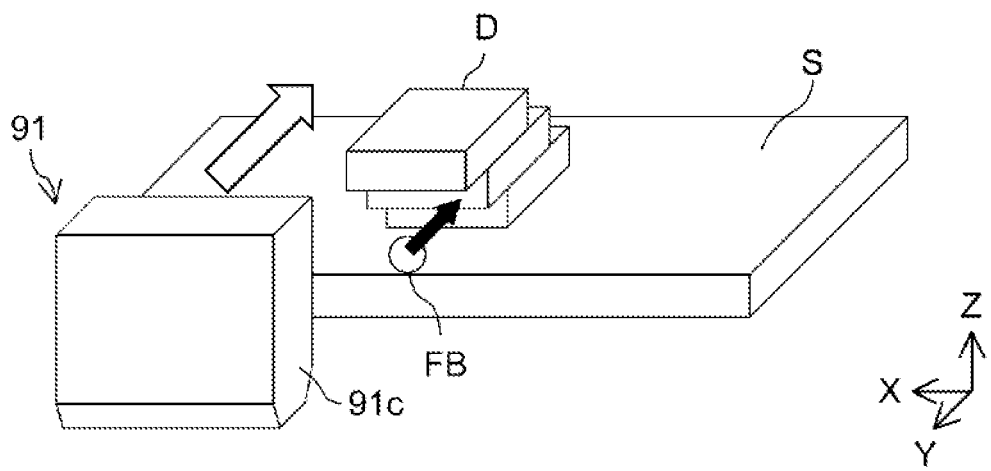
FIG. 15A is a diagram showing substrate cleaning in a first state of the cleaning head shown in FIG. 14.
Figure 15B:
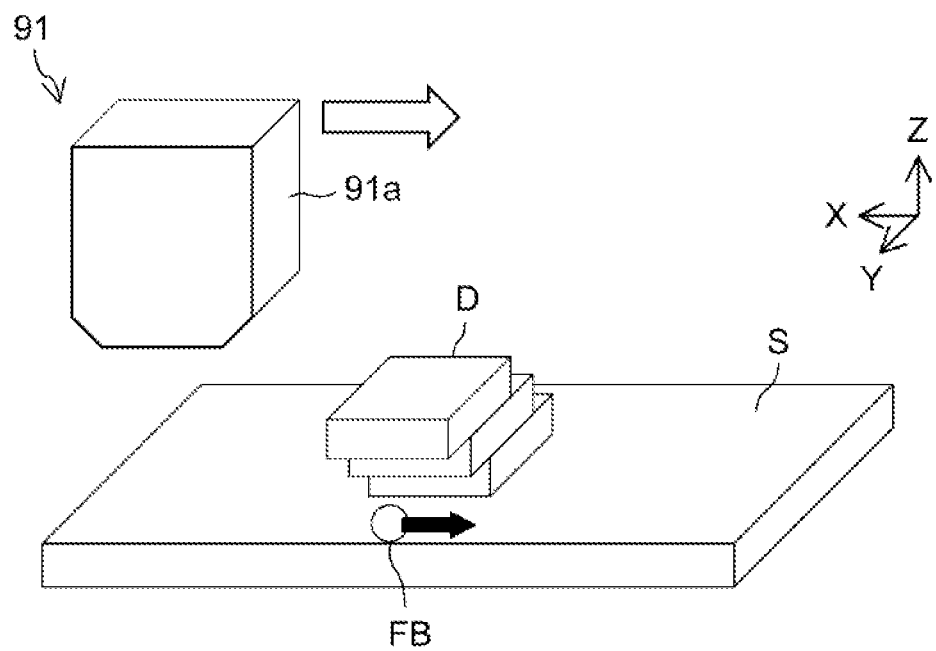
FIG. 15B is a diagram showing substrate cleaning in a second state of the cleaning head shown in FIG. 14.

A cleaning head according to a second modification example will be explained with reference to FIG. 14, FIG. 15A, and FIG. 15B. FIG. 14 is a top view showing the cleaning head and a substrate according to the second modification example. FIG. 15A is a diagram showing substrate cleaning executed by the cleaning head in a first state. FIG. 15B is a diagram showing substrate cleaning executed by the cleaning head in a second state.

The structure of a cleaning head 91 according to a second modification example is the same as that of the cleaning head according to the first modification example. However, as shown in FIG. 14, the cleaning head 91 according to the second modification example is rotated around a supporting point G by the drive section 93 in a plane parallel with the substrate S and is capable of being disposed in an arbitrary state between the first state shown in solid line segments and the second state shown in dotted line segments. Here, in the first state, the blowout opening 101b of the first nozzle 101 and the blowout opening 102b of the second nozzle 102 of the cleaning head 91 extend along the X axis direction in a planar view. In the second state, the blowout opening 101b of the first nozzle 101 and the blowout opening 102b of the second nozzle 102 of the cleaning head 91 extend along the Y axis direction in a planar view. Herewith, appropriate air blowout can be executed in accordance with a state on the substrate.

For example, as shown in FIG. 15A, if the substrate S, on which dice D are laminated, is to be cleaned when the cleaning head 91 is in the first state, since the cleaning head 91 moves in a direction shown by a white arrow along the Y axis direction, the movement of a foreign body FB in a direction shown by a black arrow is hindered by the dice D, so that the foreign body FB cannot be removed in some cases. On the other hand, if the cleaning head 91 is set in the second state by rotating the cleaning head 91 90 degrees, since the cleaning head can be relatively moved in a direction shown by a white arrow along the X axis direction, the transfer of the foreign body FB in a direction shown by a black arrow is not hindered by the dice D as shown in FIG. 15B, so that it becomes possible to remove the foreign body FB. Here, it is conceivable that the cleaning head 91 moves or the substrate S moves, that is to say, the cleaning head 91 and the substrate S move relative to each other. It is important that a clearance between the cleaning head 91 and the surface of the substrate S or the surface of the uppermost die D should be appropriately set. When the substrate S is moved by a transfer lane 52, since the rise of the substrate S is associated with the transfer of the substrate S, the clearance becomes unstable in some cases. Therefore, in order to keep the clearance constant, it is preferable that the cleaning head 91 should be moved to execute cleaning.

Third Modification Example

Figure 16A:
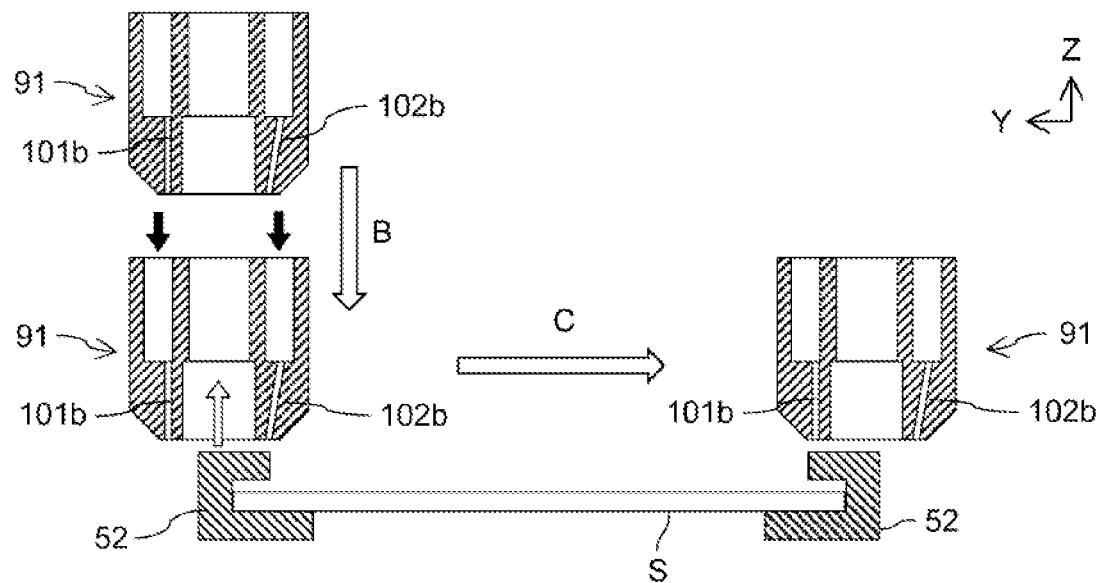
FIG. 16A is a cross-sectional view showing the behavior of a cleaning head in the forth movement thereof according to a third modification example.
Figure 16B:
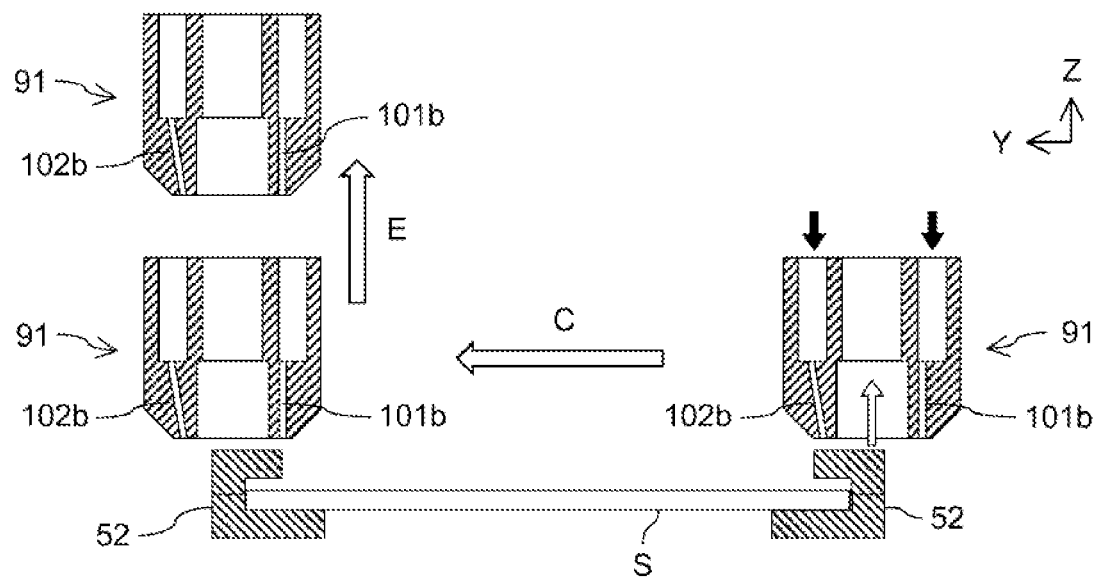
FIG. 16B is a cross-sectional view showing the behavior of the cleaning head in the back movement thereof according to the third modification example.

A cleaning head according to a third modification example will be explained with reference to FIG. 16A and FIG. 16B. FIG. 16A is a diagram showing the behavior of the cleaning head in the forth movement thereof according to the third modification example. FIG. 16B is a diagram showing the behavior of the cleaning head in the back movement thereof according to the third modification example.

The cleaning head 91 according to the third modification example is configured to be able to make the body section of its own rotate 180 degrees in a horizontal plane. Herewith, it becomes possible to change the dispositions of nozzles with respect to the traveling direction of the body section. Since an optimal state of the cleaning head 91 can be set in accordance with a space between the cleaning head 91 and a substrate S, an effective foreign body removal, for example, can be achieved through the back-and-forth movement of the cleaning head 91.

For example, as shown in FIG. 16A, in the forth movement, the blowout opening 101b of the first nozzle 101 is set perpendicular to the surface of the substrate S, and the blowout opening 102b of the second nozzle 102 is set aslant toward the surface of the substrate S. In other words, the blowout opening 102b of the second nozzle 102 that is a nozzle on the side of the traveling direction of the cleaning head 91 is aslant. Here, the forth movement is a movement in which the cleaning head 91 moves from left to right in FIG. 16A.

In the back movement, as shown in FIG. 16B, the cleaning head 91 is rotated, and the blowout opening 102b of the second nozzle 102 is aslant toward the surface of the substrate S, and the blowout opening 101b of the first nozzle 101 is perpendicular to the surface of the substrate S. In other words, the blowout opening 102b of the second nozzle 102 that is a nozzle on the side of the traveling direction of the cleaning head 91 is aslant. Here, the back movement is a movement in which the cleaning head 91 moves from right to left in FIG. 16B. By setting the angles of the two nozzles in the back movement opposite to those in the forth movement, the states of air blown out from the two nozzles in the back movement become the same as those in the forth movement. Herewith, it also becomes possible that only light foreign bodies that are easily scattered are removed by reducing the amounts of air flows in the forth movement, and heavy foreign bodies are removed by increasing the amounts of air flows in the back movement.

Fourth Modification Example

Figure 17A:
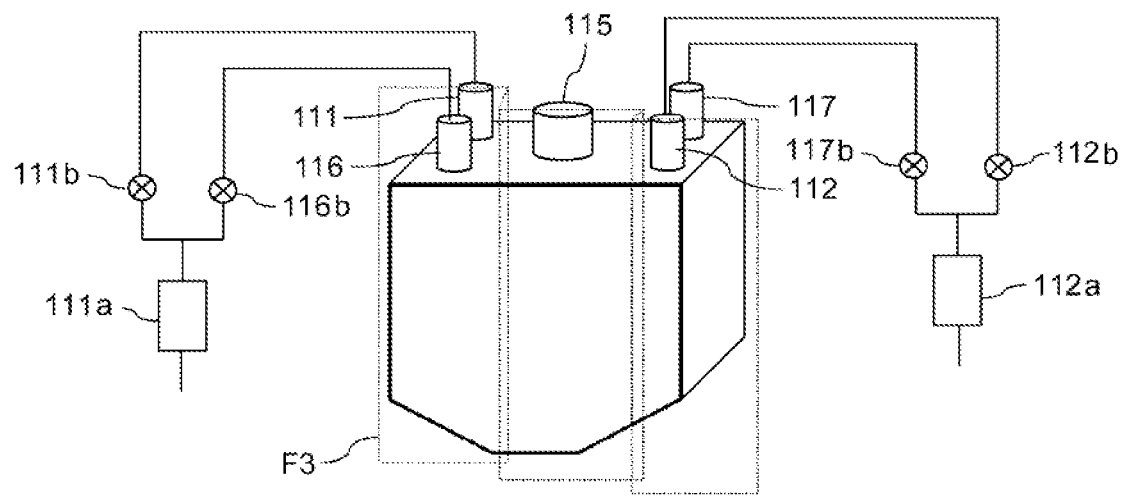
FIG. 17A is a schematic configuration diagram of a cleaning head according to a fourth modification example.
Figure 17B:
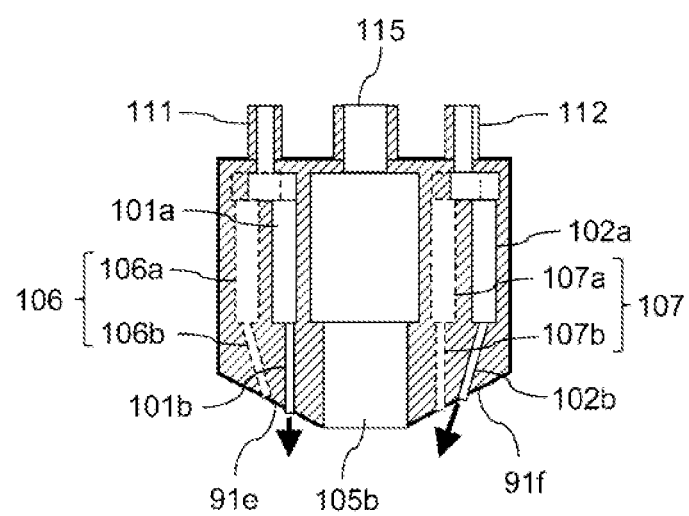
FIG. 17B is a cross-sectional view taken along an F3 plane shown in FIG. 17A.

A cleaning head according to a fourth modification example will be explained with reference to FIG. 17A and FIG. 17B. FIG. 17A is a schematic configuration diagram of the cleaning head according to the fourth modification example. FIG. 17B is a cross-sectional view taken along F3 plane shown in FIG. 17A.

In the third modification example, by rotating the body section of the cleaning head 91 in a horizontal plane, the disposition of the first nozzle 101 with the perpendicular blowout opening and the disposition of the second nozzle 102 with the aslant blowout opening are changed. The cleaning head 91 according to the fourth modification example is configured in such a way that the cleaning head 91 includes plural nozzle blowout openings having different angles respectively and the amounts of air supplied to supply pipes are switched in accordance with angles required in the cleaning of the substrate S using valves.

As shown in FIG. 17A, the cleaning head 91 according to the fourth modification example further includes a sixth supply pipe 116 and a seventh supply pipe 117 on the upper portion of the body section of its own in comparison with the cleaning head according to the example. A first supply pipe 111 and the sixth supply pipe 116 are respectively connected to devices (not shown) that supply compressed air and the like via valves 111b, 116b, and a flow rate control device 111a, and the opening and closing and the flow rate of each of the valves 111b and 116b are controlled by a control section 8. A second supply pipe 112 and the seventh supply pipe 117 are respectively connected to devices (not shown) that supply compressed air and the like via valves 112b, 117b, and a flow rate control device 112a, and the opening and closing and the flow rate of each of the valves 112b and 117b are controlled by a control section 8.

In addition, as shown in FIG. 17B, the cleaning head 91 according to the fourth modification example further includes a sixth nozzle 106 connected to the sixth supply pipe 116 and a seventh nozzle 107 connected to the seventh supply pipe 117 in comparison with the cleaning head according to the example. Furthermore, a nozzle surface that is the bottom end of the blowout opening 101b of the first nozzle 101 is positioned on an aslant surface 91e that is located near to the bottom surface 91c of the body section and rises higher as getting farther from the bottom surface 91c. A nozzle surface that is the bottom end of the blowout opening 102b of the second nozzle 102 is positioned on an aslant surface 91f that is located near to the bottom surface 91c of the body section but on the opposite side of the aslant surface 91e and that rises higher as getting farther from the bottom surface 91c.

The fourth nozzle 106 includes a through hole that is formed through the top surface to the bottom surface of the body section of the cleaning head 91 and the cross-section of which shows one large rectangle and one small rectangle, and a supply section 106a that is connected to the sixth supply pipe 116 is formed in the upper portion of the body section and a blowout opening 106b is formed in the lower portion. A nozzle surface that is the bottom end of the blowout opening 106b is positioned on the aslant surface 91e and outside of the blowout opening 101b. The seventh nozzle 107 includes a through hole that is formed through the top surface to the bottom surface of the body section of the cleaning head 91 and the cross-section of which shows one large rectangle and one small rectangle, and a supply section 107a that is connected to the seventh supply pipe 117 is formed in the upper portion of the body section and a blowout opening 107b is formed in the lower portion. A nozzle surface that is the bottom end of the blowout opening 107b is positioned on the aslant surface 91f and inside of the blowout opening 102b.

As shown in FIG. 17B, the blowout opening 106b of the sixth nozzle 106 extends aslant toward the suction opening 105b rather than perpendicularly to the surface of the substrate S from the supply section 106a, and the blowout opening 107b of the seventh nozzle 107 extends perpendicularly to the surface of the substrate S from the supply section 107a.

When the first nozzle 101 is used, the control section 8 opens the valve 111b, and at the same time, closes the valve 116b. When the sixth nozzle 106 is used, the control section 8 closes the valve 111b, and at the same time, opens the valve 116b. When the second nozzle 102 is used, the control section 8 opens the valve 112b, and at the same time, closes the valve 117b. When the seventh nozzle 107 is used, the control section 8 closes the valve 112b, and at the same time, opens the valve 117b.

Fifth Modification Example

Figures 18A, 18B:
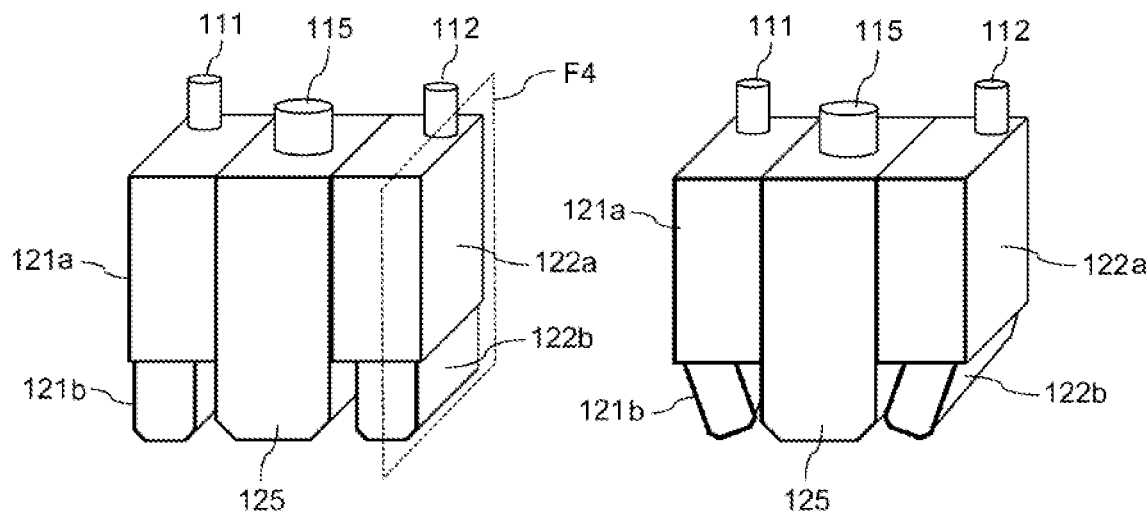
FIG. 18A is a schematic configuration diagram of a cleaning head according to a fifth modification example.
FIG. 18B is a diagram showing a state in which the blowout sections of the cleaning head shown in FIG. 18A are moved.
Figure 18C:
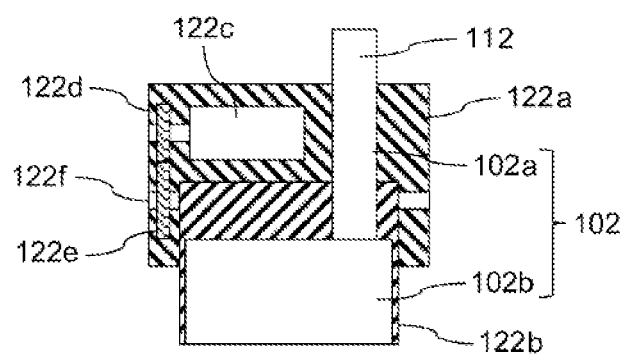
FIG. 18C is a cross-sectional view taken along an F4 plane shown in FIG. 18A.

A cleaning head according to a fifth modification example will be explained with reference to FIG. 18A, FIG. 18B, and FIG. 18C. FIG. 18A is a schematic configuration diagram of the cleaning head according to the fifth modification example. FIG. 18B is a diagram showing a state in which the blowout sections of the cleaning head shown in FIG. 18A are moved. FIG. 18C is a cross-sectional view taken along F4 plane shown in FIG. 18A.

There are the plural nozzle blowout openings having different angles respectively in the fourth modification example, but these angles are set to predefined angles respectively. The cleaning head 91 according to the fifth modification example is configured in such a way that the angles of blowout openings can be changed arbitrarily.

As shown in FIG. 18A, the body section of the cleaning head 91 according to the fifth modification example includes: a first nozzle section 121; a second nozzle section 122; and a suction section 125. The first nozzle section 121 includes a supply section 121a and a blowout section 121b. The second nozzle section 122 includes a supply section 122a and a blowout section 122b. In the cleaning head 91, a first supply pipe 111 is fixed to the upper part of the first nozzle section 121, a second supply pipe 112 is fixed to the upper part of the second nozzle section 122, and an exhaust pipe 115 is fixed to the upper part of the suction section 125.

The first nozzle section 121 includes a first nozzle 101 (see FIG. 7) connected to the first supply pipe 111 as is the case with the example. As shown in FIG. 18C, the second nozzle section 122 includes a second nozzle 102 connected to the second supply pipe 112 as is the case with the example. The suction section 125 includes a suction aperture 105 (see FIG. 7) connected to the exhaust pipe 115 as is the case with the example.

As shown in FIG. 18C, the supply section 122a of the second nozzle section 122 includes: a motor 122c; a gear 122d fixed to the rotary shaft of the motor 122c; and a gear 122e engaging with the gear 122d. The blowout section 122b of the second nozzle section 122 is rotatably fixed to the supply section 122a by a support axis 122f to which the gear 122e is fixed. The structure of the first nozzle section 121 is the same as that of the second nozzle section 122.

As shown in FIG. 18B, a control section 8 is configured to be able to change the angle of the blowout section 122b with respect to the surface of a substrate S by rotating the motor 122c. Herewith, for example, it is possible to extend the blowout opening 101b of the first nozzle 101 perpendicularly to the surface of the substrate S from a supply section 101a, and extend the blowout opening 102b of the second nozzle 102 aslant toward a suction opening 105b rather than perpendicularly to the surface of the substrate S from a supply section 102a. In addition, it is possible to extend the blowout opening 101b of the first nozzle 101 aslant toward the suction opening 105b rather than perpendicularly to the surface of the substrate S from the supply section 101a, and extend the blowout opening 102b of the second nozzle 102 perpendicularly to the surface of the substrate S from the supply section 102a.

Sixth Modification Example

Figure 19A:
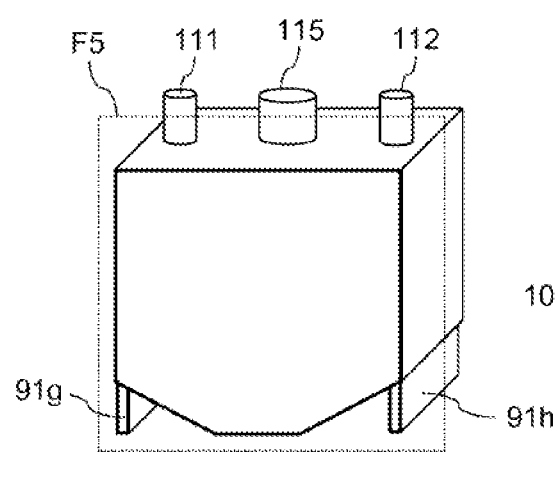
FIG. 19A is a schematic configuration diagram of a cleaning head according to a sixth modification example.
Figure 19B:
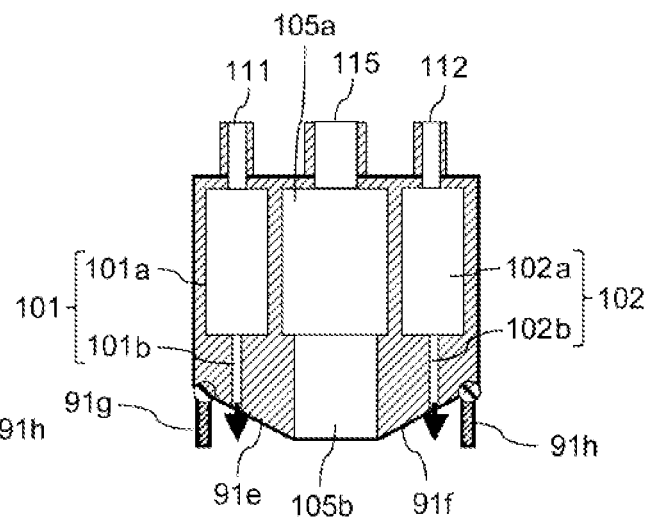
FIG. 19B is a cross-sectional view taken along an F5 plane shown in FIG. 19A.
Figure 19C:
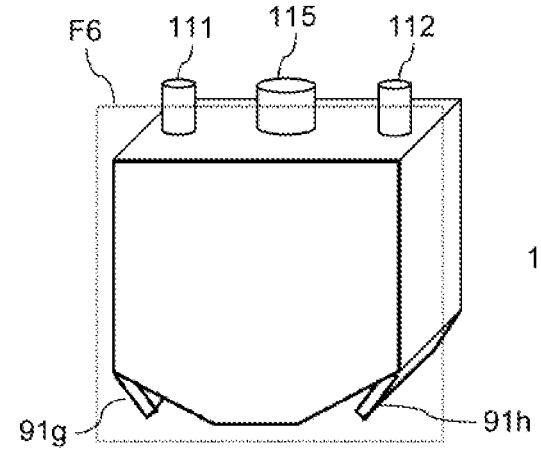
FIG. 19C is a diagram showing a state in which the flaps of the cleaning head shown in FIG. 19A are moved.
Figure 19D:
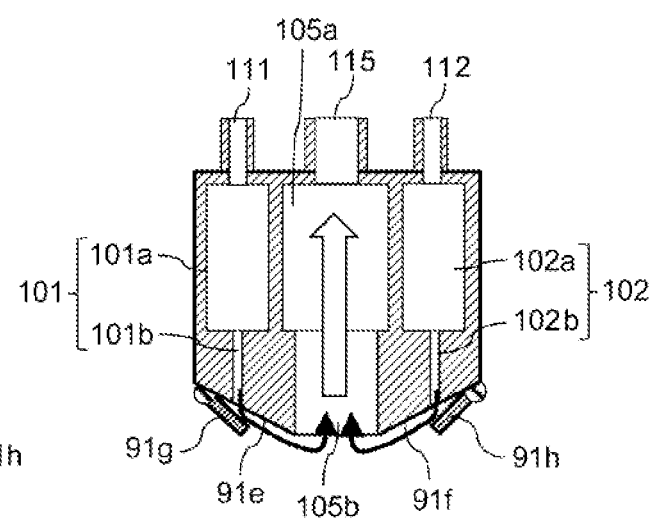
FIG. 19D is a cross-sectional view taken along an F6 plane shown in FIG. 19C.

A cleaning head according to a sixth modification example will be explained with reference to FIG. 19A, FIG. 19B, FIG. 19C, and FIG. 19D. FIG. 19A is a schematic configuration diagram of the cleaning head according to the sixth modification example. FIG. 19B is a cross-sectional view taken along the F5 plane shown in FIG. 19A. FIG. 19C is a diagram showing a state in which the flaps of the cleaning head shown in FIG. 19A are moved. FIG. 19D is a cross-sectional view taken along the F6 plane shown in FIG. 19C.

In the fifth modification example, the entireties of the blowout sections are moved to change the blowout angles of the blowout sections. The cleaning head 91 according to the sixth modification example is configured in such a way that the blowout directions of blowout openings are kept fixed, and the blowout directions are changed using the flap mechanisms installed in front of the blowout openings.

To put it concretely, as shown in FIG. 19A and FIG. 19B, the cleaning head 91 according to the sixth modification example further includes flaps 91g and 91h connected to the lower portions of the body section of its own in comparison with the cleaning head according to the example. Furthermore, a nozzle surface that is the bottom end of the blowout opening 101b of a first nozzle 101 is positioned on an aslant surface 91e that is located near to the bottom surface 91c of the body section and that rises higher as getting farther from the bottom surface 91c. A nozzle surface that is the bottom end of the blowout opening 102b of a second nozzle 102 is positioned on an aslant surface 91f that is located near to the bottom surface 91c of the body section but on the opposite side of the aslant surface 91e and that rises higher as getting farther from the bottom surface 91c. In addition, as shown in FIG. 19B, the blowout opening 102b of the second nozzle 102 is configured to extend perpendicularly to the surface of the substrate S from a supply section 102a as is the case with the blowout opening 101b of the first nozzle 101.

As shown in FIG. 19C and FIG. 19D, a control section 8 is configured to change the angles of air blown out from the blowout openings 101b and 102b with respect to the surface of the substrate S by rotating the flaps 91g and 91h. For example, by opening the flap 91g widely to keep the flap 91g away from the aslant surface 91e, and at the same time, by opening the flap 91h narrowly to keep the flag 91h close to the aslant surface 91f, it becomes possible as is the vase with the example that air is blown out from the blowout opening 101b of the first nozzle 101 perpendicularly to the surface of the substrate S and air is blown out from the blowout opening 102b of the second nozzle 102 aslant toward a suction opening 105b rather than perpendicularly to the surface of the substrate S. On the contrary, by opening the flap 91g narrowly to keep the flap 91g close to the aslant surface 91e, and at the same time, by opening the flap 91h widely to keep the flag 91h away from the aslant surface 91f, it becomes possible that air is blown out from the blowout opening 101b of the first nozzle 101 aslant toward a suction opening 105b rather than perpendicularly to the surface of the substrate S and air is blown out from the blowout opening 102b of the second nozzle 102 perpendicularly to the surface of the substrate S.

Seventh Modification Example

Figure 20:
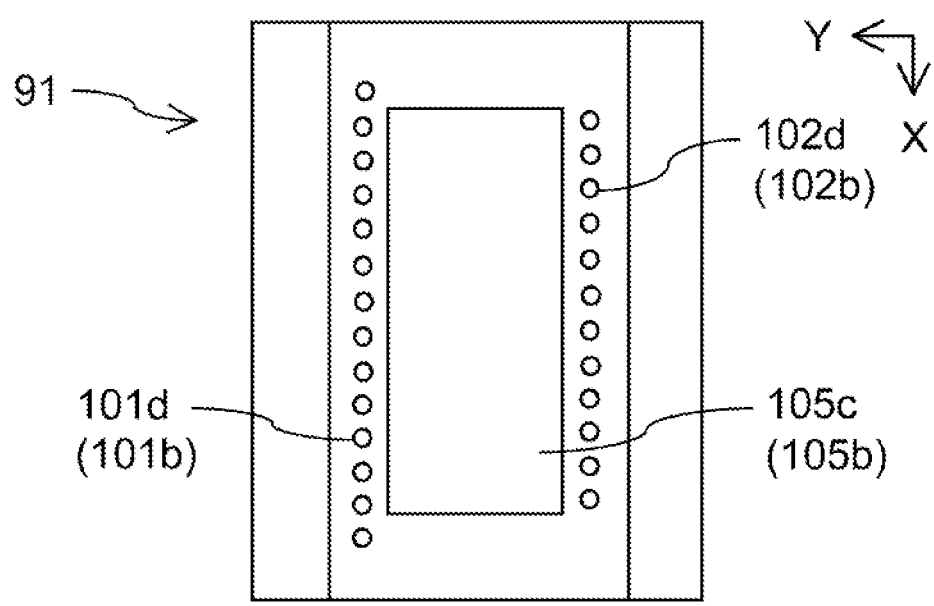
FIG. 20 is a bottom surface view of a cleaning head according to a seventh modification example.

A cleaning head according to a seventh modification example will be explained with reference to FIG. 20. FIG. 20 is a bottom surface view of the cleaning head according to the seventh modification example.

Although the blowout opening 101b of the first nozzle 101 and the blowout opening 102b of the second nozzle 102 are described as elongated slit-like shapes respectively in the example, it is conceivable that each of the blowout opening 101b of a first nozzle 101 and the blowout opening 102b of a second nozzle 102 is composed of a series of plural small blowout holes disposed along a straight line in the cleaning head according to the seventh modification example. The shapes of the open ends 101d of the blowout opening 101b of the first nozzle 101 and the shapes of the open ends 102d of the blowout opening 102b of the second nozzle 102 can be circular or polygonal.

Plural holes are formed from the supply section 101a of the first nozzle 101 and from the supply section 102a of the second nozzle 102 through the portions of the body section of the cleaning head 91 near to the suction opening 105b of the suction aperture 105 located in the lower portion of the cleaning head 91. The first nozzle 101 includes plural blowout openings 101b arranged in a row, and the second nozzle 102 includes plural blowout openings 102b arranged in a row. Alternatively, it is also conceivable that, after the blowout opening 101b of the first nozzle 101 and the blowout opening 102b of the second nozzle 102 are formed in slit-like shapes as is the case with the example, lids that respectively cover the blowout opening 101b of the first nozzle 101 and the blowout opening 102b of the second nozzle 102 are formed, and the open ends 101d and 102d are formed by making plural holes arranged in two rows on the lids respectively, on the bottom surface 91c of the cleaning head 91.

In the above descriptions, although the disclosure achieved by the present disclosers has been explained concretely on the basis of the embodiment, the example and the modification examples, this disclosure is not limited to the above-described embodiment, example and modification examples, and it goes without saying that various kinds of alternations can be made to the above-described embodiment, examples and modification examples.

For example, although the descriptions have been made under the assumption that the air blowout openings of the first and second nozzles are rectangular in the example, it is conceivable that the air blowout openings are polygons each of which has a parallel surface, for example, even-numbered polygons.

Furthermore, in the example, the descriptions have been made assuming that the body section is an octahedron, but the body section can be a hexahedron.

In addition, it is conceivable that, after measuring the sizes of actual foreign bodies (particles), the flow rates of air are controlled on the basis of the measurement result. Controlling the flow rates of air makes it possible that not only foreign bodies are surely collected but also the usage amount of air is minimized. For example, the sizes of particles adhering to the surface of a substrate are measured through image recognition using images photographed by the substrate recognition camera, and if there are no small foreign bodies, air blowing-out targeting heavy foreign bodies is executed in both forth movement and back movement of a cleaning head.

In the control of the flow rate of air in accordance with the sizes of particles, it is conceivable that only air suction is executed without executing air blowing-out. In the case of collecting bulky particles, adequate cleanliness can be obtained using only air suction in some cases. It is possible to operate a cleaning head in such a way that the cleaning head only sucks air to collect bulky particles in its forth movement and blows out air to collect minute particles in its back movement. Furthermore, it is also conceivable that, if the cleaning head repeats its back-and-forth movement plural times, the flow rate of air of the cleaning head is controlled in steps to collect foreign bodies in the order of the largest particle to the smallest.

In addition, it is also conceivable that the types of foreign bodies are predicted through image recognition, and the flow rate of air is controlled on the basis of the predicted mass datum (weight) of each type of foreign body.

In addition, the habitudes of foreign bodies, which are sucked from the suction opening 105b, are checked by measuring the foreign bodies using the particle counter, and, for example, a correlation between the weights of various foreign bodies and the delay times from the suctions of those foreign bodies to the start of the counting is extracted, and in a case where plural foreign bodies are to be removed, the flow rate of air can be controlled on the basis of the weights of those foreign bodies estimated from the above correlation using a delay time required in this case. In this case, since substrate cleaning is sequentially executed on the rows of the substrate in the order of the frontmost row to the backmost row (a row is a cleaning area with its width equal to the width of the cleaning head), sucked foreign body measurement results obtained about previous rows or previous substrate s are fed back to cleaning processing on the subsequent rows or subsequent substrate s. Cleaning processing on a first row or a first substrate is performed under a preset condition obtained by the evaluation of the relevant product.

Furthermore, as is the case with the before-mentioned particle counter, the flow rate of air can be controlled on the basis of measurement results obtained by measuring foreign bodies on the substrate using a bulky particle counter (particle monitor) that detects fallen particles on the substrate. In this case, the bulky particle counter is installed on the upstream side of the cleaning head 91 and foreign bodies on the substrate are measured in advance using the bulky particle counter. As for the measurement place of a substrate where the measurement is executed by the bulky particle counter, the entirety of the substrate can be measured in advance while the substrate is being ready and waiting for being cleaned, or an area that is located on the substrate on which cleaning is being executed and that is to be cleaned next can be measured while the substrate is stopping its movement just before cleaning the area is started. Since the above measurement has influence on the throughput (cleaning time) of the cleaning, the cleaning condition can be changed (through a feedback function) in units of rows, substrate s, products (lots), or the like on which cleaning is to be executed.

Although the case where air is supplied to the first nozzle and the second nozzle has been described in the example, gas such as carbon dioxide, mixture gas of carbon dioxide gas and particles of carbon dioxide, or the like can be used instead of air. For example, it is also conceivable that mixture gas of carbon dioxide gas and particles of carbon dioxide are blown out from the second nozzle, and air or the like is blown out from the first nozzle in order to prevent particles from scattering.

In the example, although the case where a substrate is cleaned has been explained, it is conceivable that a wafer is cleaned. Cleaning a wafer along dicing lines makes it possible that not only foreign bodies on the wafer but also foreign bodies stuck in the grooves of the dicing lines can be removed.

In addition, in the example, the intermediate stage 31 is prepared in order to shorten the moving distance of the bonding head 41 and shorten the processing time, but it is also conceivable that the die bonder is configured to be equipped with the bonding head 41 that directly picks up a die D from a wafer without preparing the intermediate stage 31.

Furthermore, it is conceivable that the die bonder is configured to be equipped with a flip head that can flip a die upside down.

In addition, the die bonder can be configured to be equipped with plural mounting sections, each of which includes a pickup section, an intermediate stage section, and a bonding section, and plural transfer lanes, or can be configured to be equipped with plural mounting sections, each of which includes a pickup section, an intermediate stage section, and a bonding section, and one transfer lane.

What is claimed is:

1. A manufacturing method for semiconductor device comprising the steps of:
   (a) transferring a substrate to a die bonding apparatus that includes: a transfer section for transferring a substrate on which a die is to be mounted in a first direction; a cleaning head including a first nozzle and a second nozzle that blow out air to the substrate and a suction aperture that sucks in air from the substrate side; and a drive section that moves the cleaning head in a second direction that is different from the first direction, wherein the suction aperture is rectangular in a planar view, long sides of the suction aperture extend in the first direction, and the suction aperture is disposed between a blowout opening of the first nozzle and a blowout opening of the second nozzle while being located near to both of the blowout openings, the blowout opening of the first nozzle is configured to extend along one of the long sides of the suction aperture in a planar view, and is also configured to extend perpendicularly to a surface of the substrate, and the blowout opening of the second nozzle is configured to extend along another of the long sides of the suction aperture in a planar view, and is also configured to extend to extend aslant toward the suction aperture rather than perpendicularly to the surface of the substrate;
   (b) transferring a wafer ring holding a dicing tape to which a die is attached;
   (c) cleaning the substrate;
   (d) picking up the die; and
   (e) bonding the picked-up die to the substrate or a die that has already been bonded;
   wherein the (c) step is a step in which a flow rate of air of the first nozzle is set larger than that of the second nozzle, and the cleaning is conducted while the cleaning head is being moved in the second direction.

2. A manufacturing method for semiconductor device comprising the steps of:
   (a) transferring a substrate to a die bonding apparatus that includes: a transfer section for transferring a substrate on which a die is to be mounted in a first direction; a cleaning head including a first nozzle and a second nozzle that blow out air to the substrate and a suction aperture that sucks in air from the substrate side; and a drive section that moves the cleaning head in a second direction that is different from the first direction, wherein the suction aperture is rectangular in a planar view, long sides of the suction aperture extend in the first direction, and the suction aperture is disposed between a blowout opening of the first nozzle and a blowout opening of the second nozzle while being located near to both of the blowout openings, the blowout opening of the first nozzle is configured to extend along one of the long sides of the suction aperture in a planar view, and is also configured to extend perpendicularly to a surface of the substrate, and the blowout opening of the second nozzle is configured to extend along another of the long sides of the suction aperture in a planar view, and is also configured to extend to extend aslant toward the suction aperture rather than perpendicularly to the surface of the substrate;
   (b) transferring a wafer ring holding a dicing tape to which a die is attached;
   (c) cleaning the substrate;
   (d) picking up the die; and
   (e) bonding the picked-up die to the substrate or a die that has already been bonded;
   wherein the (c) step is a step in which the flow rates of air of the first nozzle and the second nozzle are controlled in steps when the cleaning head is moved back and forth once or more.

3. The manufacturing method for semiconductor device according to claim 2,
   wherein the suction aperture sucks air while the first nozzle and the second nozzle stop blowing out air during the forth movement of the cleaning head, and
   the suction aperture sucks air while the first nozzle and the second nozzle blow out air during the back movement of the cleaning head.

* * * * *